United States Patent [19]

Maegawa et al.

[11] Patent Number: 5,371,397
[45] Date of Patent: Dec. 6, 1994

[54] SOLID-STATE IMAGING ARRAY INCLUDING FOCUSING ELEMENTS

[75] Inventors: Shigeto Maegawa; Hidekazu Yamamoto; Hiroshi Kawashima, all of Itami, Japan

[73] Assignee: Mitsubishi Denki Kabushiki Kaisha, Tokyo, Japan

[21] Appl. No.: 18,146

[22] Filed: Feb. 16, 1993

[30] Foreign Application Priority Data

Oct. 9, 1992 [JP] Japan .................. 4-298135

[51] Int. Cl.$^5$ ............................. H01L 27/14
[52] U.S. Cl. ..................... 257/432; 257/229; 257/233; 257/436; 377/57; 377/60
[58] Field of Search ............. 257/229, 432, 436, 230, 257/233, 214, 215, 435; 377/57–63

[56] References Cited

U.S. PATENT DOCUMENTS

| 4,694,185 | 9/1987 | Weiss ................... | 257/432 |
| 5,118,924 | 6/1992 | Mehra et al. ........... | 257/432 |
| 5,172,206 | 12/1992 | Iizuka ................. | 257/436 |

FOREIGN PATENT DOCUMENTS

| 60-145776 | 8/1985 | Japan . | |
| 61-64158 | 4/1986 | Japan . | |
| 62-130560 | 6/1987 | Japan . | |
| 01270362 | 10/1989 | Japan ........... | 257/432 |
| 2-65171 | 3/1990 | Japan . | |
| 2-103962 | 4/1990 | Japan . | |
| 2-280376 | 11/1990 | Japan . | |
| 02309674 | 12/1990 | Japan ........... | 257/432 |
| 0412567 | 1/1992 | Japan ........... | 257/436 |
| 0451568 | 2/1992 | Japan ........... | 257/432 |

OTHER PUBLICATIONS

Ishihara et al, "A High Photosensitivity IL-CCD Image Sensor With Monolithic Resin Lens Array", IEEE, International Electron Devices Meeting, Dec. 1983, pp. 497–500.

*Primary Examiner*—Rolf Hille
*Assistant Examiner*—Mahshid Saadat
*Attorney, Agent, or Firm*—Leydig, Voit & Mayer

[57] ABSTRACT

A solid-state imaging device includes a semiconductor substrate in which an element part including a plurality of light responsive elements for generating charge carriers in response to incident light and a transfer part for transferring the charge carriers generated in each light responsive element are incorporated; a lens layer is disposed on the element part so that incident light is collected in the light responsive elements; and a light beam dispersion layer is disposed between the lens layer and the element part and includes two light transmissive layers having different refractive indices for dispersing light collected by the lens layer so that collected light entering respective light responsive elements is closer to a parallel beam than the incident light. By suppressing broadening of incident light in the semiconductor substrate at the light responsive elements, fewer charge carriers enter the CCD channel region and smear is reduced.

6 Claims, 14 Drawing Sheets

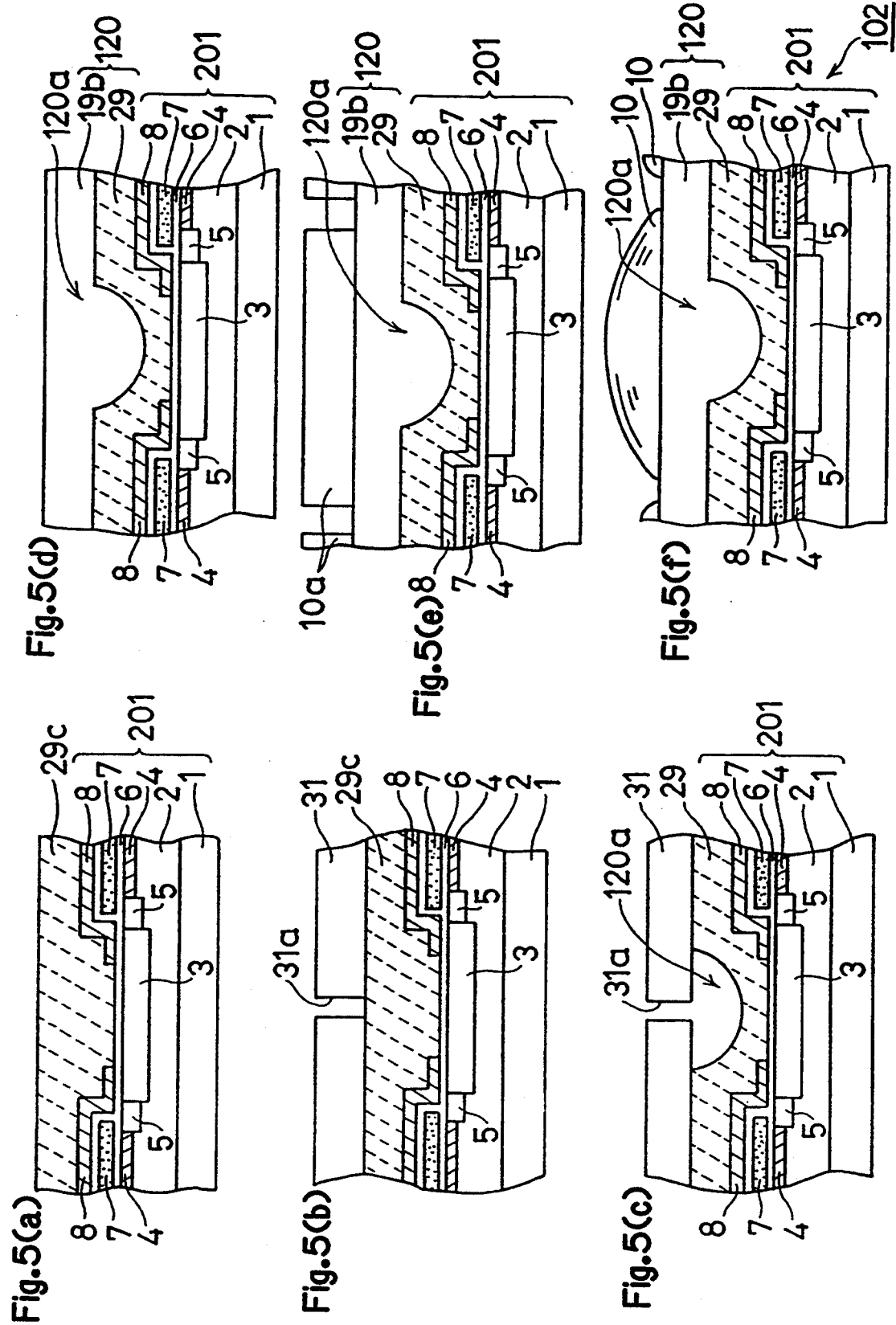

SOLID-STATE IMAGING ARRAY INCLUDING FOCUSING ELEMENTS

FIELD OF THE INVENTION

The present invention relates to a solid-state imaging device and a production method therefor and, more particularly, to a construction and a production method of a light beam dispersion layer to reduce smear by dispersing a collected light beam incident on a light receiving part.

BACKGROUND OF THE INVENTION

FIGS. 13(a)–13(b) and 14(a)–14(b) are diagrams grams explaining a prior art solid-state imaging device presented by Ishihara et al at International Electron Device Meeting, 1983. FIG. 13(a) is a plan view showing a disposition of a diffused region on a semiconductor substrate and FIG. 13(b) is a plan view showing a disposition of a charge transfer electrode and a light shielding film. FIGS. 14(a) and 14(b) are cross sections, respectively, taken along a line XIVa—XIVa and a line XIVb—XIVb of FIG. 13(b). Here, in FIGS. 13(a) and 13(b), a flattening film and a lens layer are omitted.

In the figures, a solid-state imaging device 200 comprises an element part 201 including a plurality of light receiving, i.e. responsive, parts that generate electrical signal charges in response to incident light. The light receiving parts have a generally square configuration in plan and are disposed in two-dimensional array, vertical charge coupled devices (hereinafter referred to as CCD), which are disposed among the respective arrays of the light receiving parts, are designed to transfer charges generated in the respective light receiving parts in the vertical direction, a transfer gate part which is disposed between each above-described light receiving part and the vertical CCD, a lens layer 203 which is disposed on the element part 201 and is formed so that incident light is collected in each region corresponding to each light receiving part, and an optical path length adjusting layer 202 which is disposed between the element part 201 and the lens layer 203 and adjusts the optical path length of light collected by the lens layer 203. More particularly, in the element part 201, a p-type well region is formed in an n-type silicon substrate 1. On the surface of the p-type well region 2, a first n-type semiconductor layer 3 serving as the above-described light receiving part, a second n-type semiconductor layer 4 serving as a channel region of the above-described vertical CCD (hereinafter referred to as n-type CCD channel region) and a low concentration n-type semiconductor region 4a serving as a channel region of the above described transfer gate part (hereinafter referred to as n⁻-type TC channel region) are formed. A channel separating region comprising a p-type semiconductor layer 5 is formed around the first n-type semiconductor layer 3 which is the light receiving part.

Further, a CCD gate electrode comprising a first polycrystalline silicon (hereinafter referred to as poly-Si) film 7a and a CCD gate electrode comprising a second poly-Si film 7b are alternatingly disposed along the transfer direction of the vertical CCD via a gate insulating film comprising a silicon oxide film 6 over the CCD channel region 4. Here, a portion over the n⁻-type TG channel region 4a of the first poly-Si film 7a is a transfer gate electrode.

In addition, an aluminum film 8 is formed covering the CCD gate electrode and the transfer gate electrode, namely, a portion of the first poly-Si film 7a over the n-type CCD channel region 4 and a portion of the second poly-Si film 7b over the n⁻-type TG channel region 4a. Here, this aluminum film 8 is a light shielding film which shields the light incident on the respective channel regions 4 and 4a (hereinafter referred to as Al-light shielding film).

Further, the optical path length adjusting layer 202 is a flattening film 9 comprising a transparent resin, which is formed on the whole surface of the Al-light shielding film 8. The lens layer 203 comprises convex microlenses 10 which are disposed on the respective regions corresponding to the plural light receiving parts 3 on the flattening film 9 and collect incident light A into the respective light receiving parts. Here, the microlens 10 is disposed so that a center thereof is exactly over a center of the light receiving part and, as shown by the alternating long and two short dashed lines of FIG. 13(a), has an elliptical configuration in plan which overhangs the CCD channel regions 4. Therefore, incident light over the regions around the light receiving part 3, namely, the n-type CCD channel region 4, the n-type TG channel region 4a and the p-type channel separating region 5, is introduced into the light receiving part 3.

Incident light A on the light receiving surface of the solid-state imaging device 200 is collected at the light receiving part 3 by the microlens 10. At the same time, incident light on the Al-light shielding film 8 is also collected at the light receiving part 3 by the microlens 10. As a result, each light receiving part 3 has actually a large sensitivity even if the area thereof is small. Further, photo-electrons which are caused by the collected light at the light receiving part 3 are accumulated in the light receiving part 3, are transferred to the CCD channel region 4 through the TG channel region 4a with a predetermined timing and are output to a signal processing device at the latter stage by the CCD transferring operation.

However, in the prior art solid-state imaging device 200, the photo-electrons caused by incident light are also generated in the vicinity of the CCD channel region 4 of the above-described p-type well region 2 and these electrons enter into the CCD channel region 4 and mix with signal charges being transferred, resulting in noise called smear. In other words, a focus f10 of the lens 10 is usually set so as to be situated inside the first n-type semiconductor layer 3 constituting the light receiving part and, since incident light A unfavorably broadens conversely under the focal point, photo-electrons E0 and E1 occur in wide regions, mainly directly under the light receiving part 3, in a deeper portion of the well region 2. For example, as illustrated in FIG. 14(a), a part of the incident light A reaches a portion directly under the channel separating layer 5 and part of the photo-electrons E1 caused by the incident light enter the CCD channel region 4.

Still, such solid-state imaging device including a lens layer on an element part through a transparent insulating layer is also disclosed in Japanese Published Patent Applications Sho 61-64158, Hei 2-103962, Hei 2-280376, Sho 60-145776, Hei 2-65171. Particularly, in a solid-state imaging device described in Japanese Published Patent Applications Sho 61-64158, Hei 2-280376 and Hei 2-65171, which, similar to the above-described prior art solid-state imaging device 200, form a light collecting lens with a transparent film on a semiconductor substrate including a light receiving part and a charge transfer part, the same problem occurs as described above: smear occurs because incident light broadens in a portion under a light receiving part.

Further, in a solid-state imaging device described in Japanese Published Patent Application Sho 60-145776, in order to prevent incident light from dispersing because of a lens action of a passivation film or a layer insulating film of which a portion over a light receiving part is curved concavely, a light collecting lens is disposed over the concave part. In this case, however, incident light collected by a light collecting lens broadens in a portion under the light receiving part of the substrate, resulting in smear as the above-described device.

Further, in a solid-state imaging device described in Japanese Published Patent Application Hei 2-103962, in order to enhance light collecting ability at a light collecting lens part, the light collecting lens part is constructed with a convex lens comprising a material whose refractive index is larger and a concave lens comprising a material whose refractive index is smaller, which is disposed under the convex lens, and light is collected by the respective lenses. In this case, the broadening of incident light is much wider in a portion under a light collecting part of a substrate, thereby aggravating smear as described above.

SUMMARY OF THE INVENTION

It is an object of the present invention to provide a solid-state imaging device reducing smear that is caused by photo-electrons entering a CCD channel region, without decreasing the sensitivity of a light responsive part.

It is another object of the present invention to provide a production method therefor.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In a solid-state imaging device in accordance with the present invention, there is provided a light beam dispersion layer which includes two light transmissive layers having different refractive indices between an element part having a plurality of light receiving parts and transfer parts and a lens layer so that incident light is focused into the light receiving parts in the respective regions corresponding to the respective light receiving parts, and that light collected by the lens layer due to refraction at the light transmissive layers is dispersed to approximate a parallel light beam. Therefore, incident light collected by the lens layer becomes a collected light beam having a smaller converging angle by passing through the light beam dispersion layer and that enters the light receiving part. As a result, by suppressing broadening of incident light in a portion under the light receiving part of the semiconductor substrate, fewer signal charges enter the CCD channel region and smear is reduced. The light beam dispersion layer may comprise a light incident side light transmissive layer having a larger refractive index and a light output side light transmissive layer having a smaller refractive index.

In a solid-state imaging device in accordance with the present invention, a portion of a contacting interface between a light incident side light transmissive layer and a light output side light transmissive layer over a light receiving part is formed into a concave lens shape in the light beam dispersion layer. Therefore, dispersion of incident light at the concave contacting interface is larger than that at a flat contacting interface and the incident light enters the light receiving part as an approximately parallel light beam by passing through the light beam dispersion layer. As a result, incident light hardly broadens in the portion under the light receiving part of the semiconductor substrate and generation of smear caused by signal charges entering the CCD channel region is almost completely prevented.

In a solid-state imaging device in accordance with the present invention, a light beam dispersion layer is formed by sandwiching an intermediate light transmissive layer having a larger refractive index between light incident and output side light transmissive layers having a smaller refractive index, a contacting interface between the light incident side light transmissive layer and the intermediate light transmissive layer having a flat surface, the portions over respective light receiving parts of the contacting interface between the intermediate light transmissive layer and the light output side light transmissive layer including convex lenses. Therefore, light collected by the lens layer is respectively dispersed due to refraction at the flat and the convex interfaces. As a result, incident light hardly broadens in the portion under the light receiving part of the semiconductor substrate and smear is almost completely prevented.

In a solid-state imaging device in accordance with the present invention, a light beam dispersion layer comprises a light incident side light transmissive layer having a larger refractive index and a light output side light transmissive layer having a smaller refractive index, the portion over a light receiving part at the contacting interface between the light transmissive layers being a convex lens shape. Therefore, light collected by the lens layer is dispersed due to refraction at the convex contacting interface. As a result, broadening of incident light is suppressed in the semiconductor substrate part under the light receiving part to reduce smear caused by signal charges entering the CCD channel region.

In a solid-state imaging device in accordance with the present invention, a concave lens array film which comprises a plurality of concave lenses corresponding to a pattern of light receiving parts is adhered to the element part as the light beam dispersion layer and a convex lens array film which comprises a plurality of convex lenses corresponding to the pattern of the light receiving parts is adhered to the concave lens array film. Therefore, incident light collected by the convex lens array film is dispersed due to refraction at the concave lens array film to reduce smear. Further, the light beam dispersion layer and the lens layer are formed just by adhering the concave lens array film and the convex lens array film to the element part, resulting in simplification of the production process of the respective layers.

In production of a solid-state imaging device in accordance with the present invention, a first transparent insulating film is accumulated on the whole surface of the semiconductor substrate in which a plurality of light receiving parts and charge transfer parts are formed, a sidewall is formed in peripheral portions of the light receiving parts on the semiconductor substrate by anisotropic etching of the first transparent insulating film, a second transparent insulating film having the same refractive index as the first transparent insulating film is formed on the whole surface of the semiconductor substrate in such a manner that the convex and concave configuration of the substrate surface influences its surface configuration, a third transparent insulating film having a smaller refractive index than the second transparent insulating film is formed on the second insulating film and the convex lens comprising a material having the same refractive index as the third insulating film is formed in the respective regions corresponding to the plural light receiving parts on the third transparent insulating film. As a result, a light beam dispersion layer having a concave refraction interface corresponding to each light receiving part is formed in a relatively simple process without employing an etching mask or the like.

In production of a solid-state imaging device in accordance with the present invention, a first transparent insulating film is accumulated on the whole surface of the semiconductor substrate in which a plurality of light receiving parts and charge transfer parts are formed in such a manner that the surface of the first insulating film is flat, an anti-etching film having an aperture in a portion corresponding to the light receiving parts is formed on the first transparent insulating film, a concave surface is formed in a portion over each light receiving part of the first transparent insulating film by isotropic etching of the first transparent insulating film employing the anti-etching film as a mask, after removing the anti-etching film, a second transparent insulating film having a refractive index smaller than that of the first transparent insulating film is formed on the first film and convex lenses comprising a material having the same refractive index as the second insulating film are formed in the respective regions corresponding to the plural light receiving parts on the second transparent insulating film. As a result, the curvature or the size of the concave refraction interface of a light beam dispersion layer is easily adjusted by changing the aperture pattern of the anti-etching film, the etching conditions or the like.

In production of a solid-state imaging device in accordance with the present invention, a first thermoplastic transparent resin film is accumulated on the whole surface of the semiconductor substrate in which a plurality of light receiving parts and charge transfer parts are formed in such a manner that the convex and concave configuration of the substrate surface influences the surface configuration, a concave surface is formed in a portion over the light receiving parts by reflow of the first thermoplastic transparent resin film and a second transparent resin film having a smaller refractive index than the first thermoplastic transparent resin film is formed on the first resin film in such a manner that the surface of the second resin film is flat and convex lenses comprising a material having the same refractive index as the second resin film are formed in respective regions corresponding to the plural light receiving parts on the second resin film. As a result, it is possible to form a light beam dispersion layer having a concave refraction interface corresponding to each light receiving part in a relatively simple process without employing a sidewall or an etching mask layer.

In production of a solid-state imaging device in accordance with the present invention, a first transparent insulating film is accumulated on the whole surface of the semiconductor substrate in which a plurality of light receiving parts and charge transfer parts are formed in such a manner that the surface of the first insulating film is flat, a thermoplastic transparent resin film having the same refractive index as the first transparent insulating film is formed on the first insulating film, convex lenses are formed in the respective regions corresponding to the plural light receiving parts on the first transparent insulating film by patterning and thermal flow of the thermoplastic transparent resin film, a second transparent insulating film is formed by accumulating a transparent material having a refractive index larger than the thermoplastic resin film over the whole surface below the thermal reflow temperature in such a manner that the surface is flat, a third transparent insulating film having a refractive index smaller than the second transparent insulating film is formed on the second film, and convex lenses comprising a material having the same refractive index as the third insulating film are formed in the respective regions corresponding to the plural light receiving parts on the third transparent insulating film. As a result, the convex lens on the first transparent insulating film is formed into a shape which is most easily formed in a process and it is possible to easily adjust the converging angle or optical path length of collected light by adjusting the thicknesses of the second and the third transparent insulating films.

In production of the solid-state imaging device in accordance with the present invention, convex lenses are formed in the respective regions corresponding to plural light receiving parts on the first transparent insulating film and a transparent material having a refractive index larger than the thermoplastic resin is accumulated below the thermal reflow temperature in such a manner that the convex and concave configuration of the substrate surface influences the surface configuration. As a result, it is possible to form a flattening film and a lens layer on the convex lens in a single process, resulting in simplification of the production process.

BRIEF DESCRIPTION OF THE DRAWINGS

FIGS. 5(a) to 5(f) are diagrams explaining a method of producing the solid-state imaging device of the second embodiment in which isotropic etching is employed in forming a light beam dispersion layer.

DETAILED DESCRIPTION OF THE PREFERRED EMBODIMENT

Figure 1:
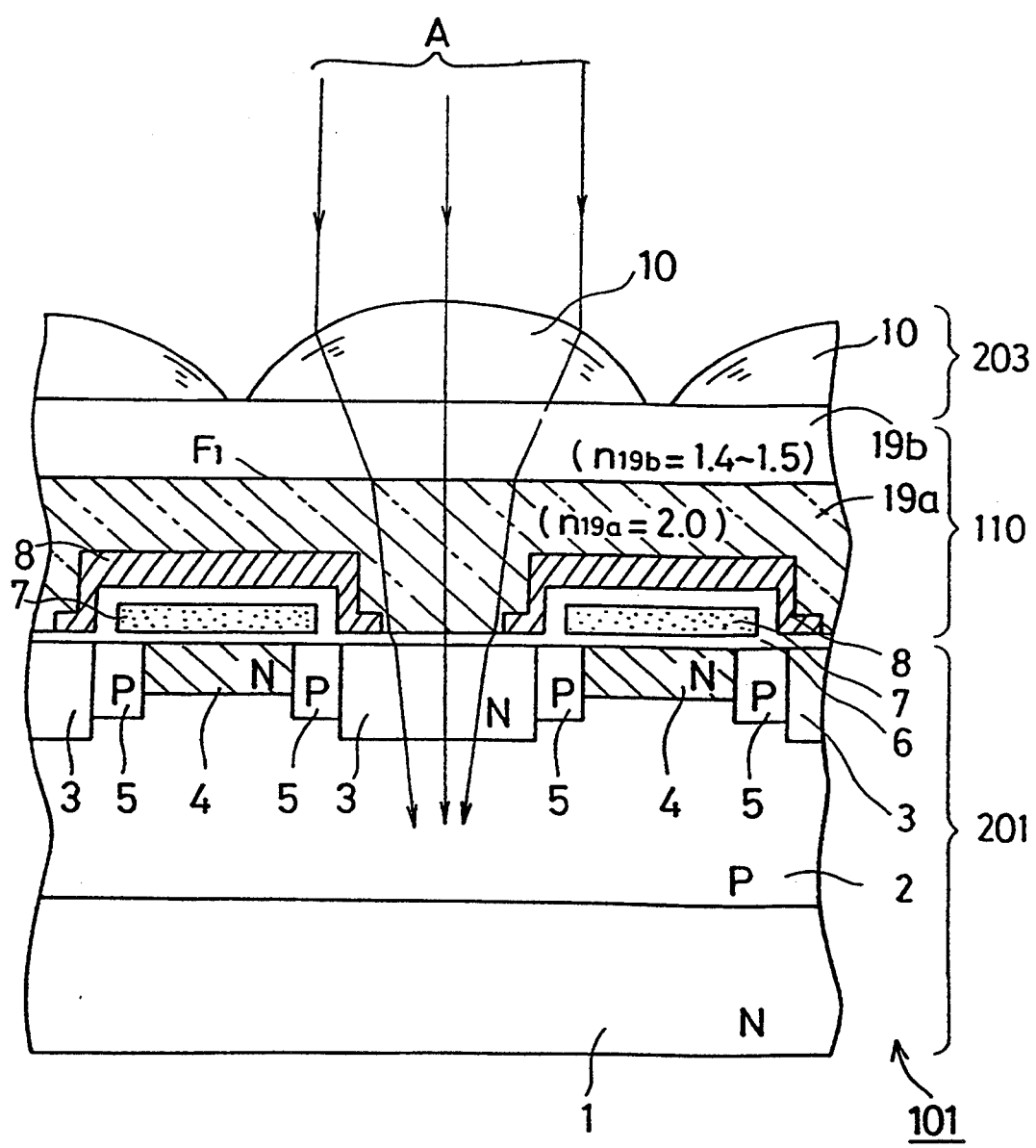
FIG. 1 is a cross sectional view illustrating a construction of a solid-state imaging device in accordance with a first embodiment of the present invention.
Figure 13A:
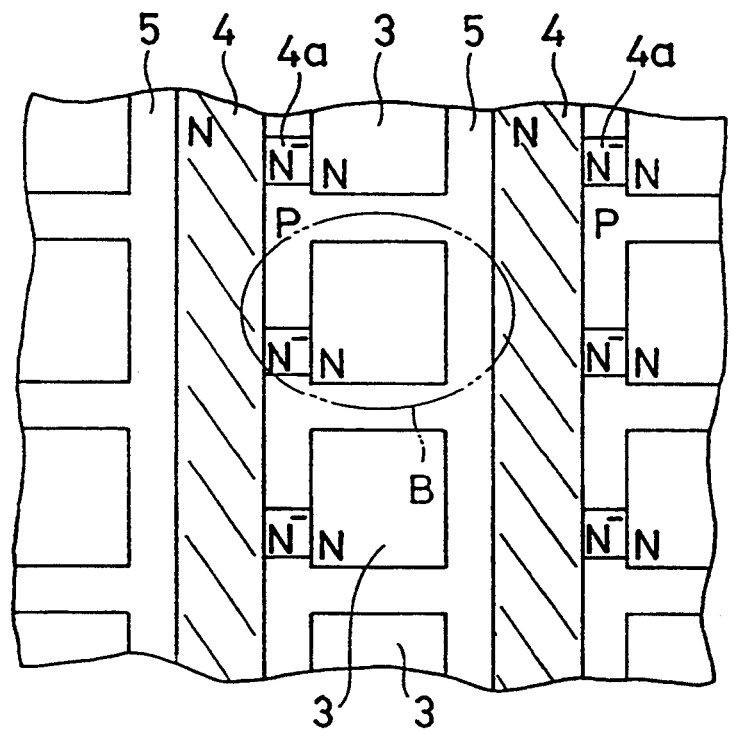
FIGS. 13(a) and 13(b) are plan views illustrating a layout of a diffused region or the like on a substrate in a prior art solid-state imaging device.
Figure 13B:
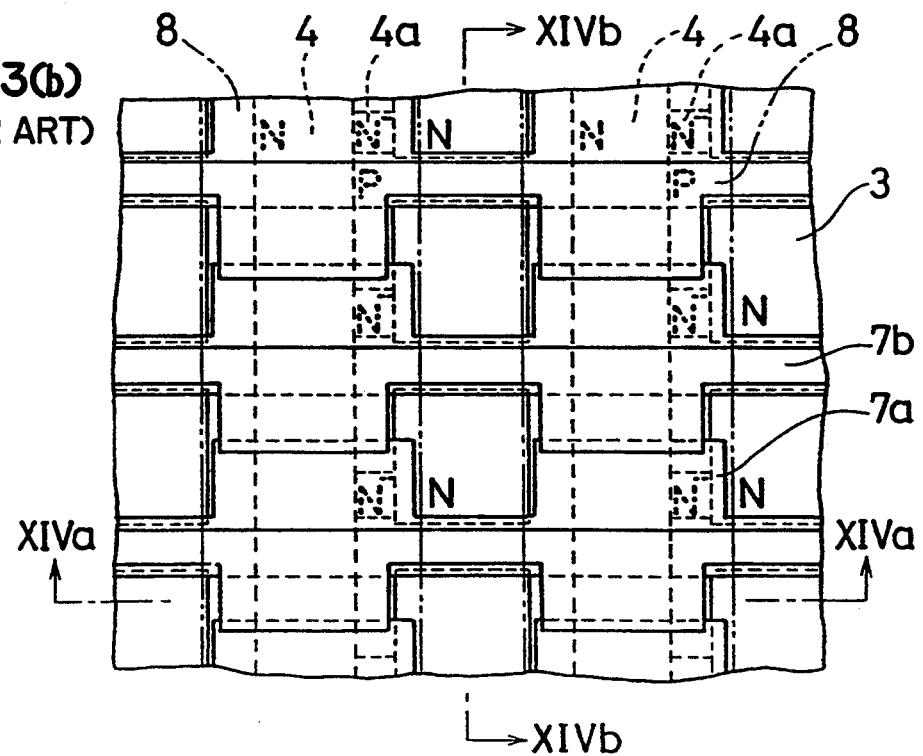

FIG. 1 is a cross sectional view for explaining a solid-state imaging device in accordance with a first embodiment of the present invention. The figure shows a sectional construction of a portion corresponding to a cross section taken along a line XIVa—XIVa of a prior art device of FIG. 13(b). Still, in each embodiment described below, such constructions as a transparent film and a lens layer over an element part in a cross section taken along a line XIVb—XIVb of FIG. 13(b) are not illustrated because the constructions are the same as those of the cross section taken along a line XIVa—XIVa.

In the figure, in a solid-state imaging device 101 of this embodiment, a contacting interface F1 between two light transmissive layers 19a and 19b having different refractive indices is disposed between an element part 201 and a lens layer 203, and there is provided a light beam dispersion layer 110 which disperses incident light A collected by the lens layer 203 so that the light beam becomes closer to a parallel beam due to refraction at the contacting interface F1. Here, the light incident side of light transmissive layer 19b comprises a silicone resin and the light output side light transmissive layer 19a comprises a silicon nitride film. The refractive index n19b of the light incident side light transmissive layer 19b is approximately 1.4 to 1.5 and the refractive index n19a, which depends on a composition ratio of the silicon nitride film, is approximately 2.0. Other constructions are the same as those of the prior art solid-state imaging device 200. Here, as a matter of convenience of explanation, a portion of the second poly-Si film 7b over the CCD channel region is shown as a CCD gate electrode 7.

Figure 2A:
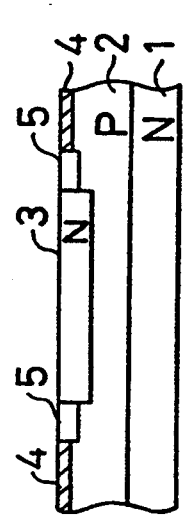
FIGS. 2(a) and 2(f) are cross sectional views explaining process steps in a method for producing the solid-state imaging device of FIG. 1.

First, a p-type impurity such as boron or an n-type impurity such as phosphorus is properly selectively implanted into an n-type silicon substrate 1, thereby to form a p-type well layer 2 in the n-type silicon substrate 1 and an n-type semiconductor layer 3 serving as a light receiving, i.e., responsive part, an n-type CCD channel region 4 and a p-type channel separating region 5 on the surface of the well layer 2 (FIG. 2(a)). Secondly, on the surface of the p-type well layer 2, first and second poly-Si films 7a and 7b are formed on a silicon oxide film 6 (refer to FIGS. 13(b) and 14(b)), and, by patterning the poly-Si films, a CCD gate electrode 7 is formed on the n-type CCD channel region 4 and a TG gate electrode is formed on an n⁻-type TG channel region 4a (refer to FIG. 13(b)). An Al-light shielding film 8 is formed covering the respective gate electrodes, resulting in a completed element part 201 (FIG. 2(b)). Thirdly, by accumulating a silicon nitride film over the whole surface of the element part 201 in such a manner that the surface thereof is as flat as possible, for example, in a biased Electron Cyclotron Resonance (ECR) type plasma Chemical Vapor Deposition (CVD) method of the like, a light output side light transmissive layer 19a of 0.1 to 1 micron thickness is formed (FIG. 2(c)) and, consecutively, the light incident side light transmissive layer 19b is formed on the light transmissive layer 19a by accumulating a silicone resin. As a result, the light beam dispersion layer 110 is formed (FIG. 2(d)).

Thereafter, thermoplastic resin, for example, OFPR-800, ODUR-1010, OEBR 100, 1000 of Tokyo Ohka Kabushiki Kaisha, or the like is applied on the light beam dispersion layer 110 by means of spin coating or the like, and peripheral end parts over the light receiving part 3 are removed by patterning the thermoplastic resin by means of photolithography. As a result, a thermoplastic resin layer 10a having a rectangular configuration in plan, which extends to the vicinity of a central portion of the CCD channel region side in the transfer direction of the vertical CCD, and to the vicinity of a central portion of the p-type channel separating region 5 in the direction perpendicular to the transfer direction, is formed over each light receiving part 3 (FIG. 2(e)). At last, by processing the thermoplastic resin layer 10a in a convex lens shape having an oblong configuration in plan by thermal reflow of the resin layer 10a at a predetermined temperature, for example, around 150° C., when OFPR-800 is employed for the thermoplastic resin, a microlens 10 is formed, resulting in a completed solid-state imaging device 101 (FIG. 2(f)).

Generally, at an interface between two different materials, an optical path L is refracted if the refractive indices thereof are different. A description is given in more detail with reference to FIG. 12(a).

When light enters from a material I having a smaller refractive index n1 into a point P1 on the interface and advances to a material II having a larger refractive index n2, suppose that an angle between a normal M1 at point P1 and incident light L1 is $\theta 1$, the angle between normal M1 and output light L2 is output angle $\theta 2$ and the angle between incident light L1 and output light L2 is refraction angle $\delta a$. According to a formula representing the principle of refraction, $n1 \sin\theta 1 = n2 \sin\theta 2$. Since n1 is smaller than n2 in this case, $\theta 1$ is larger than $\theta 2$ and refraction angle $\delta a$ is $\theta 1 - \theta 2$. Therefore, in the solid-state imaging device 101 of this embodiment, since the light beam dispersion layer 110 comprising the light incident side light transmissive layer 19b having a refractive index of approximately 1.4 to 1.5 and the light output side light transmissive layer 19a having a refractive index of approximately 2.0 is disposed between the lens layer 203 and the element part 201, incident light A collected by the microlens 10 is dispersed by refraction at the contacting interface F1 between the light transmissive layers 19a and 19b, resulting in a light beam closer to a parallel beam. In other words, incident light A enters into the light receiving part 3 at an angle close to the perpendicular to the surface thereof, thereby to suppress broadening of incident light in a deep portion under the light receiving part 3 in the p-type well region 2. As a result, fewer photo-electrons enter the CCD channel region adjacent to the light receiving part 3, reducing smear.

In this first embodiment, since the contacting interface F1 between two light transmissive layers 19a and 19b in the light beam dispersion layer 110 has a flat structure over the whole surface, it is inadequate to suppress broadening of incident light in a deep portion of the well region 2 for a large refractive index microlens 10 in the lens layer 203. In this case, although it is required to employ two transparent materials whose refractive indices are extremely different for the light transmissive layers 19a and 19b, it is not always easy to select such transparent materials due to conditions of production, light permeability or the like. Further, in order to flatten the contacting interface between two light transmissive layers as described above, the silicon nitride film having poor light permeability which comprises the light output side light transmissive layer 19a having a large refractive index is required to be thick, resulting in increased incident light attenuation in the light beam dispersion layer, showing the same evil influence as a decrease in the sensitivity of the light receiving part 3.

Figure 3:
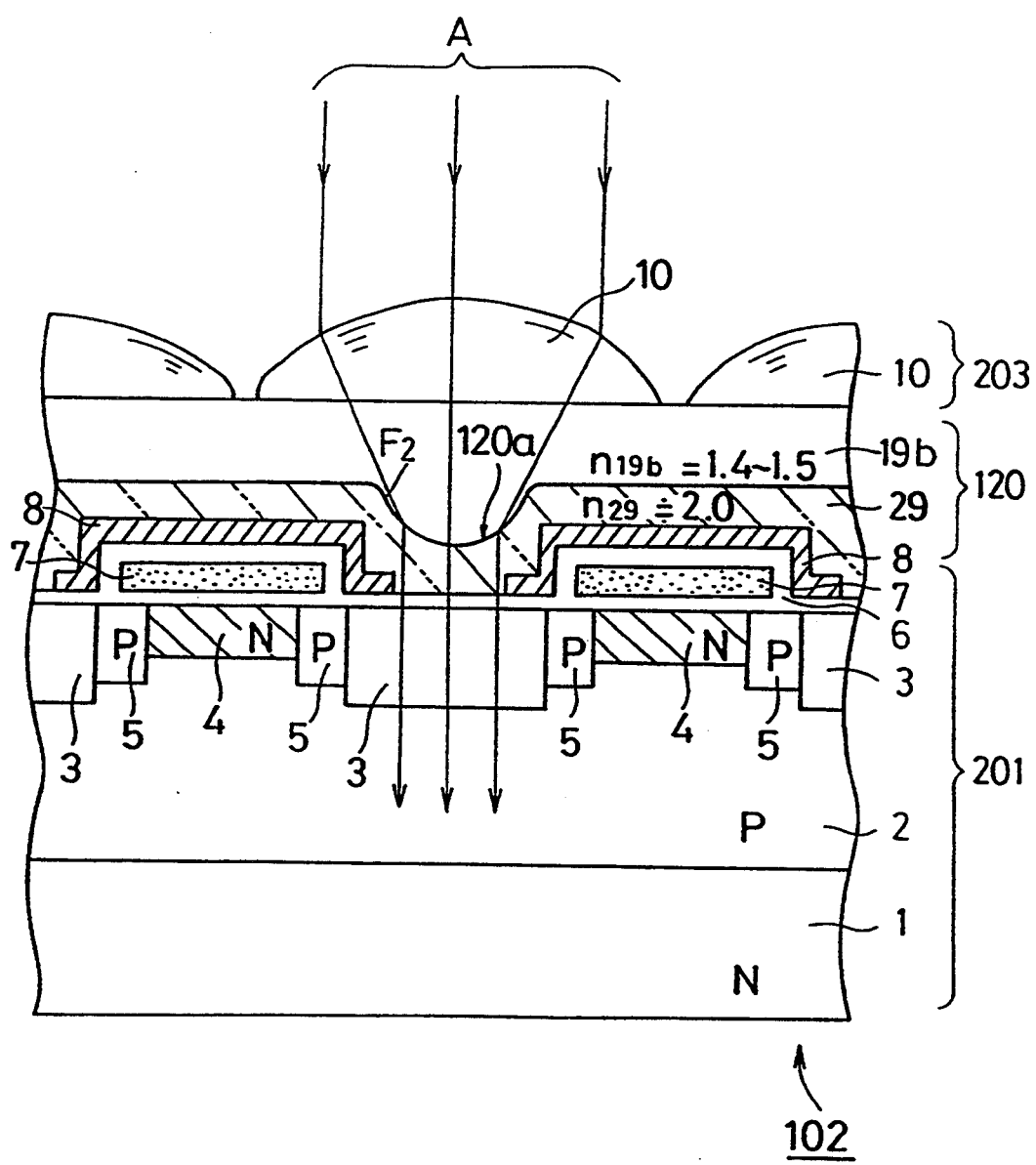
FIG. 3 is a cross sectional view illustrating a construction of a solid-state imaging device in accordance with a second embodiment of the present invention.

FIG. 3 is a diagram illustrating a sectional construction of the solid-state imaging device in accordance with a second embodiment. FIGS. 4(a)-4(f) and 5(a)-5(f) are cross sectional views explaining respectively, a first and a second production method of the solid-state imaging device. In the figures, in a solid-state imaging device 102 in accordance with this embodiment, there is provided a light beam dispersion layer 120 in which a portion of a contacting interface F2 between two light transmissive layers having different refractive indices situated over a light receiving part is concave.

Here, the light beam dispersion layer 120 which is formed on an element part 201 comprises a light output side light transmissive layer 29 having a concave spherical surface part 120a over the light receiving part 3 and a light incident side light transmissive layer 19b formed on the light transmissive layer 29. The light output side light transmissive layer 29 comprises a silicon nitride film having a refractive index of approximately 2.0 and the light incident side light transmissive layer 19b comprises a silicone resin having a refractive index of around 1.4 to 1.5 as in the first embodiment. The other constructions are the same as those of the first embodiment.

In the second embodiment having the construction as described above, the light beam dispersion layer 120 comprises the light incident side light transmissive layer 19b having a smaller refractive index and the light output side light transmissive layer 29 having a larger refractive index. Since a portion of the contacting interface F2 between these light transmissive layers over the light receiving part is concave between the element part 201 and the lens layer 203, dispersion of incident light at the concave contacting interface F2 is larger than that at a flat contacting interface and incident light A collected by the lens layer 203 enters into the light receiving part 3 as an approximately parallel light beam by passing through the light beam dispersion layer 120.

Figure 12A:
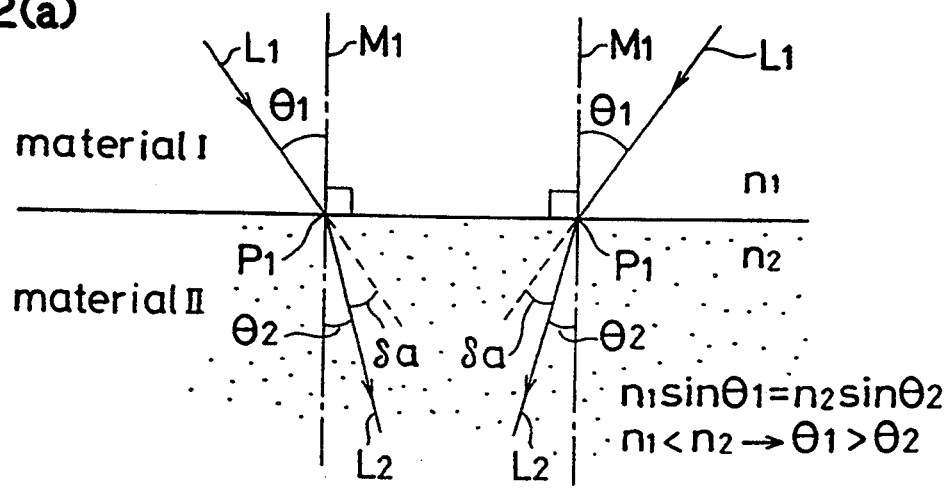
FIGS. 12(a) to 12(c) are diagrams showing optical paths at an interface between two materials having different refractive indices.
Figure 12B:
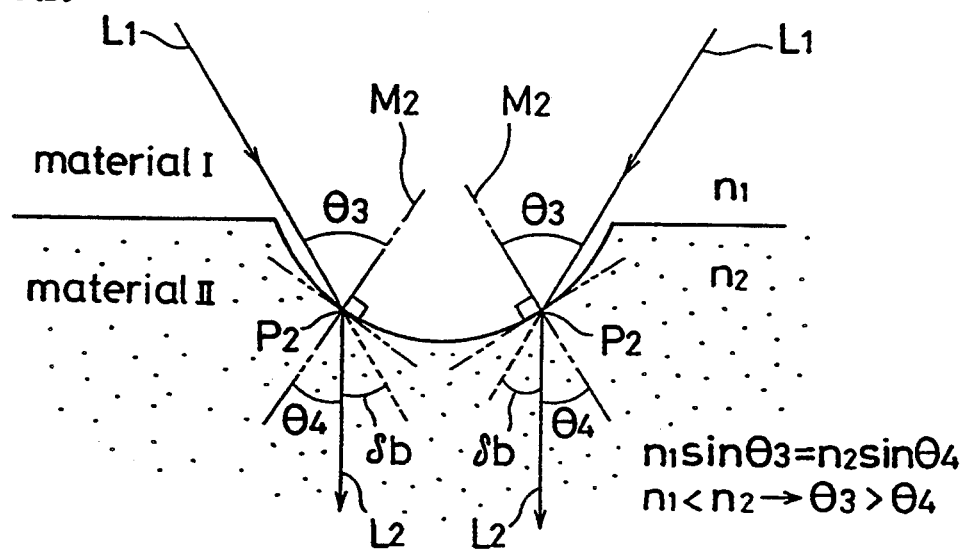

More particularly, as illustrated in FIG. 12(b), when light enters into a point P2 on the concave interface from a material I having a smaller refractive index n1 and advances in a material II having a larger refractive index n2 with an incident angle θ3, namely the angle between a normal M2 at the incident point P2 and incident light L1, that is larger than incident angle θ1 at a flat portion of the contacting interface (refer to FIG. 12(a)), according to the general formula of refraction, n1 sinθ3=n2 sinθ4. The refraction angle δb, namely, the angle between incident light L1 and output light L2 (=θ3−θ4), is larger than the refraction angle δa at the flat contacting interface (=θ1−θ2). In other words, in refraction at the concave contacting interface, the extent of dispersion of collected light is larger than that of refraction at the flat contacting interface and the incident light at the light receiving part is an approximately parallel beam. Therefore, incident light hardly broadens under the light receiving part 3 of a semiconductor substrate 1, almost completely preventing smear caused by entering of light charges into the CCD channel region 4.

Further, in this embodiment, since the silicon nitride film having poor light permeability which comprises the light output side light transmissive layer 29 is thinner over the light receiving part 3 than in the first embodiment, the attenuation of incident light is reduced, thereby avoiding decreasing sensitivity at the light receiving part 3. From such point of view, it is desirable to set the thickness of the silicon nitride film over the light receiving part 3 at 0.

First, a method in which a sidewall is employed for forming the light beam dispersion layer 120 including the concave spherical surface is described with reference to FIGS. 4(a) to 4(f). Here, the process of producing the element part 201 is omitted because the process is the same as that illustrated in FIGS. 2(a) and 2(b).

Figure 2B:
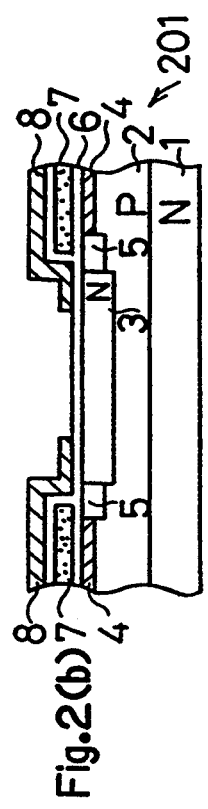
Figure 2C:
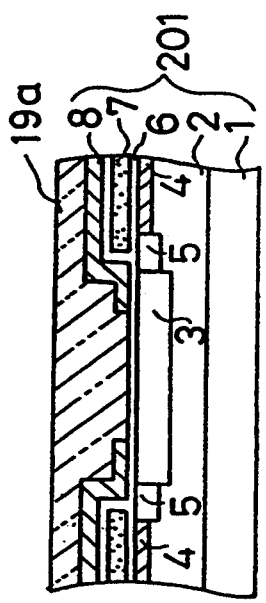
Figure 2D:
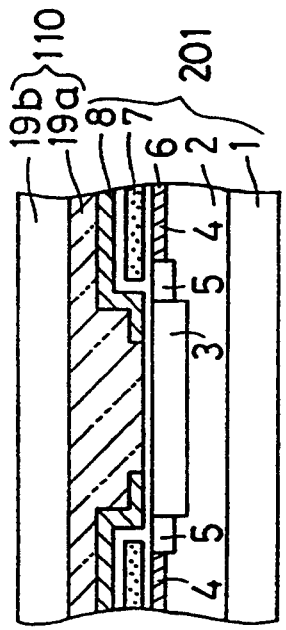
Figure 2E:
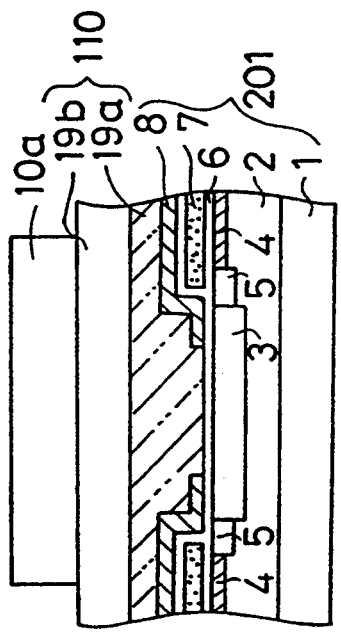
Figure 2F:
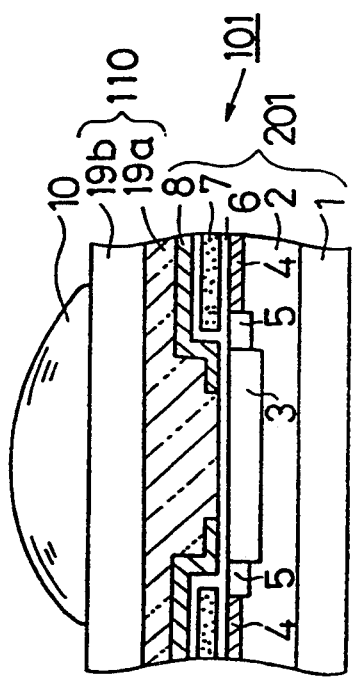
Figure 4D:
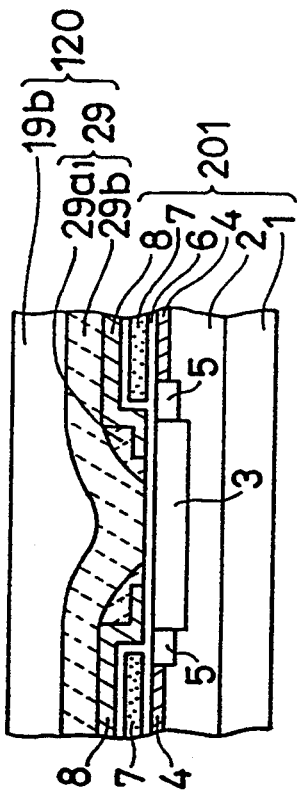
FIGS. 4(a) to 4(f) are diagrams explaining a method of producing the solid-state imaging device of the second embodiment in which a sidewall is employed for forming a light beam dispersion layer.
Figure 4E:
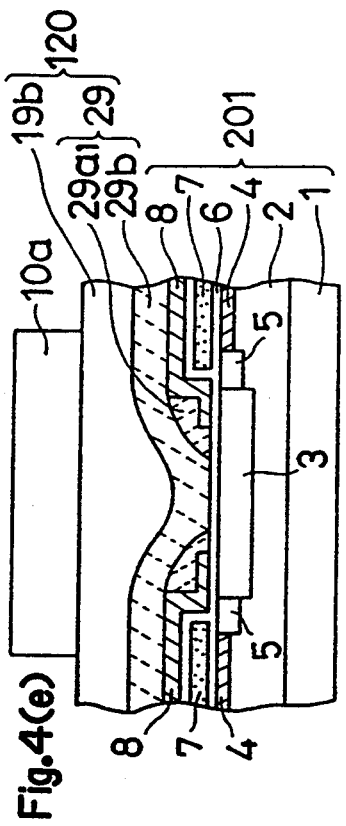
Figure 4F:
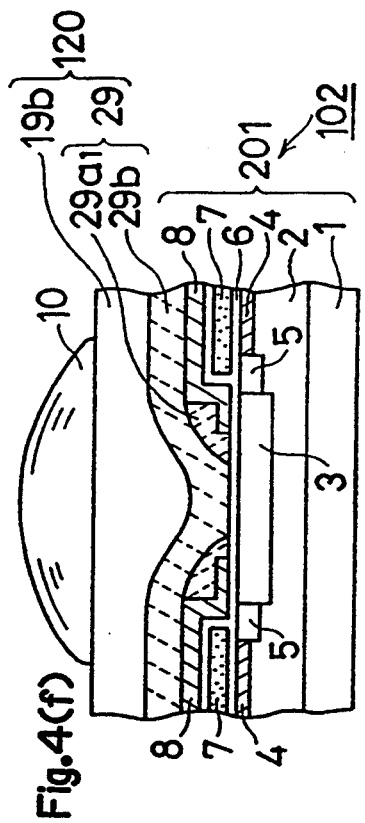
Figure 4A:
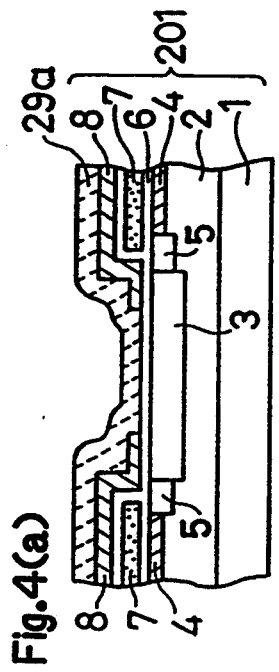

After forming the element part 201 as illustrated in FIGS. 2(a) and 2(b), a first silicon nitride film 29a is accumulated on the whole surface by plasma CVD or the like (FIG. 4(a)). At this time, the silicon nitride film 29a is required to have such a thickness as enables the sidewall to be formed by etchback of the film 29a, namely, 0.5 to 1.0 micron in this embodiment.

Figure 4B:
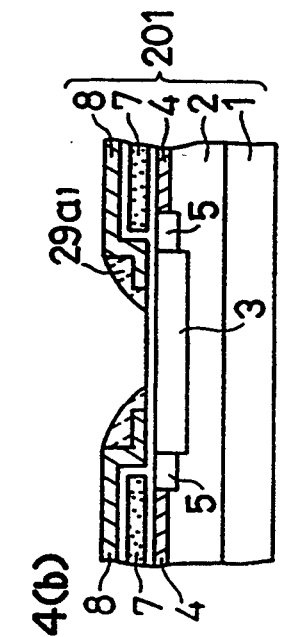
Figure 4C:
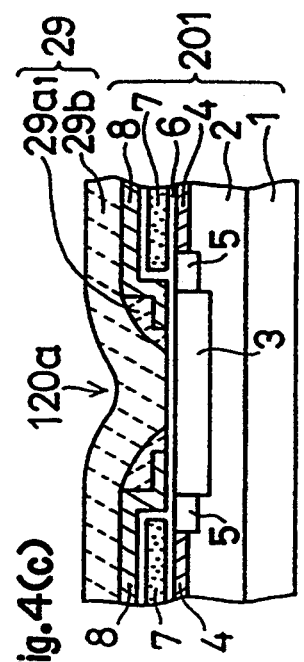

Next, performing etchback of the silicon nitride film 29a1 by anisotropic etching, a sidewall 29a1 is formed around the light receiving part 3 (FIG. 4(b)). Thereafter, a second silicon nitride film 29b is accumulated on the whole surface by plasma CVD or the like in such a manner that differences in level of the substrate surface due to the sidewall 29a1 may influence surface configuration, and the light output side light transmissive layer 29 of 0.1 to 1.0 micron thickness, of which the portion over the light receiving part is concave is formed (FIG. 4(c)). Then, similarly as in the first embodiment, by accumulating a silicone transparent resin in such a manner that the surface thereof is flat, the light incident side light transmissive layer 19b is formed (FIG. 4(d)) and, consecutively, as in the first embodiment, thermoplastic resin is applied on the light beam dispersion layer 120 by means of spin coating or the like, and peripheral end parts over the light receiving part 3 are removed by patterning the thermoplastic resin by means of photolithography or the like (FIG. 4(e)). At last, by thermal reflow of the patterned thermoplastic resin layer 10a at the predetermined temperature, the resin layer 10a is processed in a convex lens and a microlens 10 having an oblong configuration in plan is formed, resulting in a completed solid-state imaging device 102 according to the second embodiment (FIG. 4(f)). Here, by enlarging the sidewall 29a1 over the peripheral parts of the light receiving part 3 so that a portion of the sidewall 29a1 covers the central portion of the light receiving part 3, the second silicon nitride film 29b is omitted.

In the first method, as described above, since the light beam dispersion layer 120 is formed by forming the sidewall 29a1 by accumulating the first silicon nitride film 29a on the peripheral portions of the light receiving part 3 of the element part 201 and anisotropic etching thereof, accumulating the second silicon nitride film 29b in such a manner that the convex and concave parts of the substrate surface influence the surface configuration of the film 29b and then, forming the silicone resin having a refractive index smaller than that of the second silicon nitride film 29b, the light beam dispersion layer 120 having the concave refraction interface corresponding to each light receiving part is formed in a relatively simple process without employing an etching mask or the like.

Secondly, a second method to produce the solid-state imaging device in accordance with the second embodiment in which isotropic etching is employed for forming the light beam dispersion layer 120 including the concave spherical surface is described with reference to FIGS. 5(a) to 5(f). Here, the process of producing the element part 201 is also omitted because the process is the same as that illustrated in FIGS. 2(a) and 2(b).

After forming the element part 201 as illustrated in FIGS. 2(a) and 2(b), a silicon nitride film 29c is accumulated in a biassed ECR plasma CVD or the like so as to be flat as possible (FIG. 5(a)).

Next, after forming a photoresist 31 on the silicon nitride film 29c, its patterning is carried out so that an aperture part 31a is formed over the light receiving part 3 (FIG. 5(b)). Thereafter, by isotropic etching of the silicon nitride film 29c employing the photoresist 31 as a mask, a concave part 120a is formed over the light receiving part 3 of the silicon nitride film 29c, thereby to form the light output side light transmissive layer 29 (FIG. 5(c)).

Then, after removing the photoresist 31, as in the first embodiment, the light incident side light transmissive layer 19b is formed (FIG. 5(d)) and, consecutively, thermoplastic resin 10a is applied by means of spin coating and its patterning is carried out (FIG. 5(e)), and at last, by thermal reflow of the patterned thermoplastic resin layer 10a at a predetermined temperature, the resin layer 10a is processed in a convex lens and a microlens 10 having an oblong configuration in plan, resulting in a completed solid-state imaging device 102 according to the second embodiment (FIG. 5(f)). Here, in comparison with the first method employing the sidewall, the curvature of the concave lens part is adjusted to some extent by controlling the size of the aperture or the etching.

In the second method, as described above, since the light beam dispersion layer 120 is formed by accumulating the silicon nitride film 29c on the element part 201 in such a manner that the surface of the film 29c is flat, forming the concave part 120a over the light receiving part of the silicon nitride film 29c by isotropic etching of the silicon nitride film 29c employing an anti-etching mask, and after removing the anti-etching mask, accumulating the silicone transparent resin having a refractive index smaller than that of the silicon nitride film 29c on the film 29c, the curvature or the size of the concave contacting interface is easily adjusted by changing the aperture pattern of the anti-etching mask, the etching conditions or the like. Still, in this second embodiment, while the silicon nitride film having a refractive index of approximately 2.0 is employed for the light output side light transmissive layer 19a and the transparent resin having a refractive index of 1.4 to 1.5 for the light incident side light transmissive layer 19b, the materials of both light transmissive layers are not limited thereto.

FIGS. 6(a) to 6(e) are diagrams explaining a method for producing a solid-state imaging device in accordance with a variation of the second embodiment. In a solid-state imaging device 102a in accordance with this variation, the light beam dispersion layer 120 comprises a light output side light transmissive layer 29d comprising a transparent insulating film of around 1.5 refractive index and a light incident side light transmissive layer 19c comprising a fluorine series resin of around 1.3 refractive index. Here, an $SiO_2$ series material, for example, spin on glass (SOG), boron-doped phosphosilicate silicate glass (BPSG) or the like, or a polymer, for example, polymethymethacrylate (PMMA), polyglicydylmethacrylate (PGMA) or the like, of refractive index around 1.5 is employed for the transparent insulating film 29d. Other layers are exactly same as those of the second embodiment.

Figure 6A:
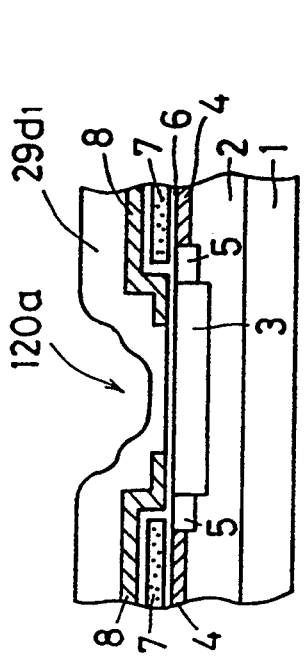
FIGS. 6(a) to 6(e) are cross sectional views explaining process steps in a method for producing a solid-state imaging device in accordance with a variation of the second embodiment.
Figure 6B:
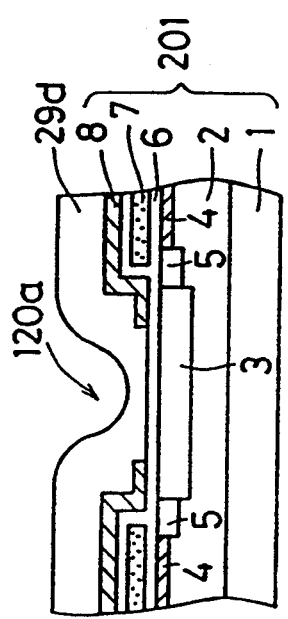
Figure 14A:
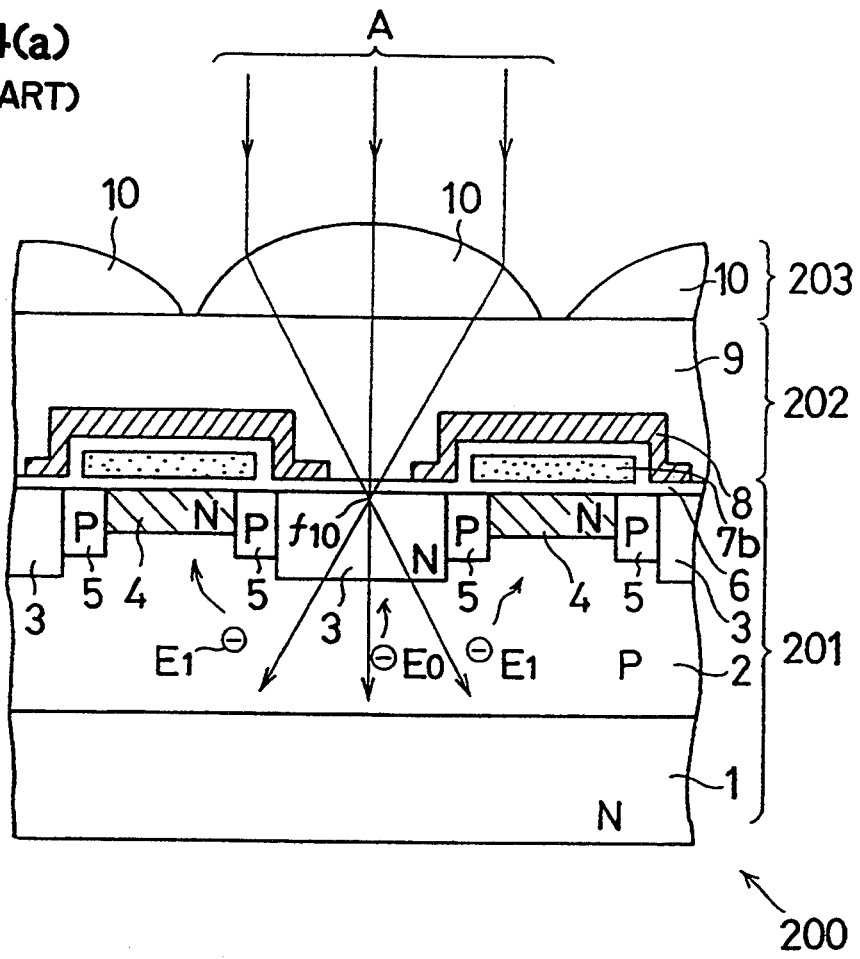
FIGS. 14(a) and 14(b) are diagrams illustrating a sectional construction of the prior art solid-state imaging device.
Figure 14B:
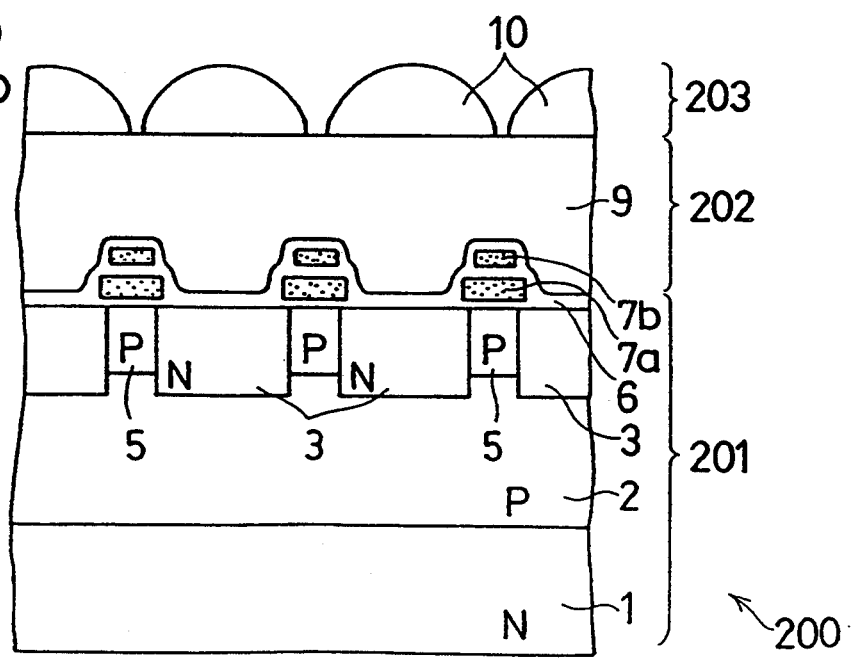

After forming the element part 201 as illustrated in FIGS. 2(a) and 2(b), with differences in level between the light receiving part 3 and the Al-light shielding film 8 in the vicinity of the light receiving part 3 and between the light receiving part 3 and the second poly-Si 7b (refer to FIG. 14(b)) in the vicinity of the light receiving part 3, a transparent resin film 29d1 is accumulated thereon by plasma CVD, spin coating or the like in such a manner that the configuration having differences in level of the substrate surface influences the surface configuration (FIG. 6(a)), and a concave part 120a having a generally square configuration in plan over the light receiving part is changed into a desired concave spherical shape by thermal reflow, resulting in the light output side light transmissive layer 29d (FIG. 6(b)).

Figure 6C:
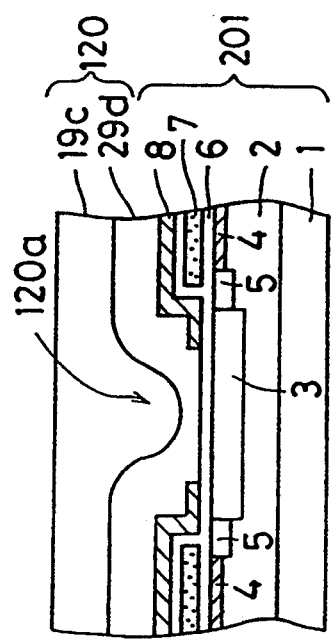
Figure 6D:
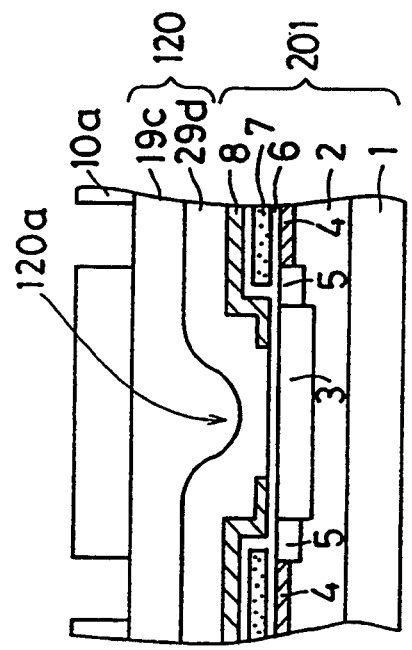
Figure 6E:
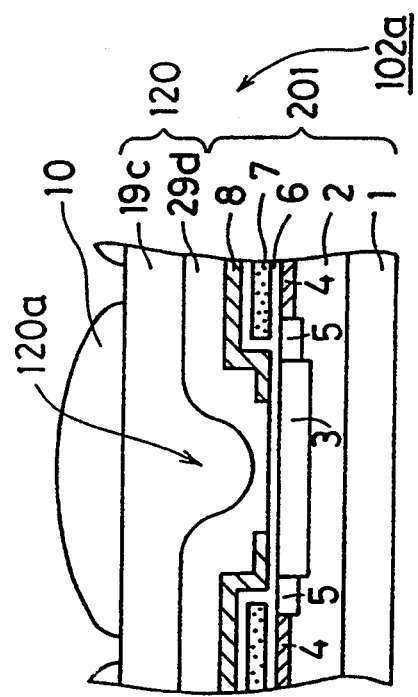

Secondly, by applying a thick layer of the fluorine series resin of approximately 1.3 refractive index on the light output side light transmissive layer 29d by spin coating or the like in such a manner that the surface thereof is flat, the light incident side light transmissive layer 19c is formed (FIG. 6(c)). Thereafter, as in the above-described second embodiment, application of thermoplastic resin by means of spin coating and its patterning are carried out (FIG. 6(d)), and by thermal reflow of the patterned thermoplastic resin layer 10a at a predetermined temperature the layer is processed into a convex lens shape, forming the microlens 10, resulting in the completed solid-state imaging device 102a according to the second embodiment (FIG. 6(e)).

In the variation of the second embodiment, as described above, since the light beam dispersion layer 120 is formed by accumulating the transparent insulating film 29d1 in such a manner that the convex and concave configuration of the substrate surface influences surface configuration, forming the light output side light transmissive layer 29d by thermal reflow of the transparent insulating film 29d1 to make the concave part 120a over the light receiving part into the predetermined shape, and forming the fluorine series transparent resin (light incident side light transmissive layer) 19c having a refractive index smaller than the transparent insulating film 29d1 on the light transmissive layer 29d, the light beam dispersion layer 120 having the concave lens part 120a corresponding to each light receiving part is formed in a relatively simple process without employing a sidewall or etching mask layer.

Figure 7:
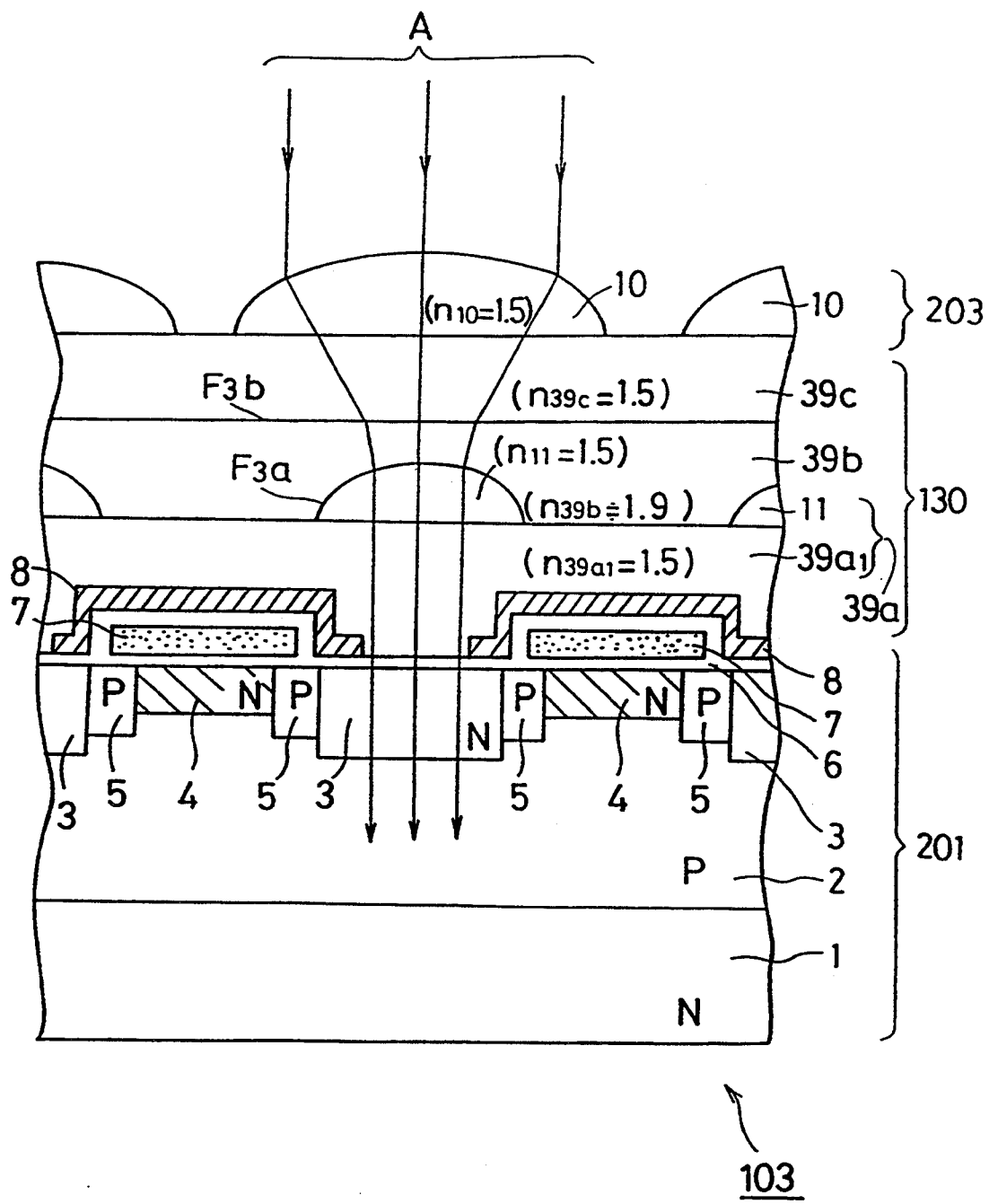
FIG. 7 is a cross sectional view illustrating a construction of a solid-state imaging device in accordance with a third embodiment of the present invention.

FIG. 7 is a cross sectional view illustrating a solid-state imaging device in accordance with a third embodiment of the present invention. In the solid-state imaging device 103 of this embodiment, a light beam dispersion layer 130 comprises a light output side light transmissive layer 39a, an intermediate transmissive layer 39b having a flat surface, which is formed on the whole surface of the transmissive layer 39a, and a light incident side light transmissive layer 39c having a flat surface, which is formed on the layer 39b. Here, the light output side light transmissive layer 39a comprises a light transmissive layer 39a₁ having a flat surface, which is formed on the element part 201, and an auxiliary convex lens 11, having an ellipse configuration in plan in which the minor axis direction is in the CCD transfer direction, which is formed on the light transmissive layer 39a₁ over the light receiving part 3.

Here, the light transmissive layers 39a₁ and 39c and the auxiliary convex lens 11 comprise a polymer of approximately 1.5 refractive index and the intermediate light transmissive layer 39b comprises silicon nitride of approximately 1.9 refractive index. The microlens 10 of the lens layer 203 comprises a polymer of refractive index of around 1.5. Other constructions are the same as those of the solid-state imaging device 101 of the first embodiment. Here, reference numeral F3a designates a concave contacting interface between the auxiliary convex lens 11 and the intermediate light transmissive layer 39b and numeral F3b designates a flat contacting interface between the intermediate light transmissive layer 39b and the light incident side light transmissive layer 39c. Numerals n39a₁, n39b and n39c designate, respectively, refractive indices of the light transmissive layers 39a₁, 39b and 39c and numeral n11 designates the refractive index of the auxiliary convex lens 11.

Figure 8A:
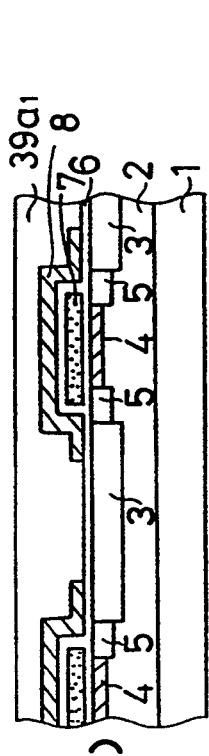
FIGS. 8(a) to 8(f) are cross sectional views explaining process steps in a method for producing the solid-state imaging device of FIG. 7.
Figure 8B:
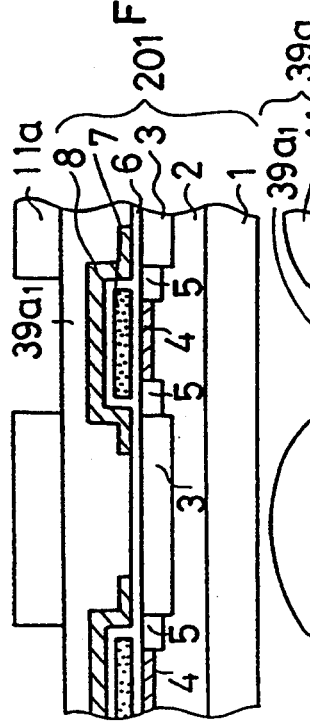
Figure 8C:
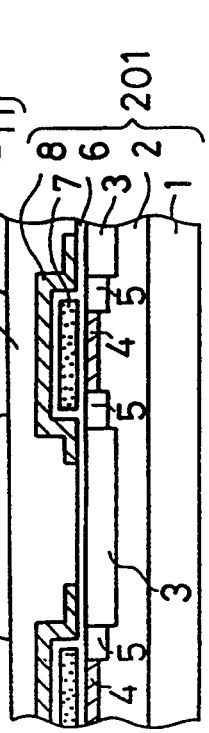

As in the above-described respective embodiments, after forming the element part 201 as illustrated in FIGS. 2(a) and 2(b), the flat light transmissive layer 39a₁ of approximately 1.5 refractive index is formed on the element part 201 by spin coating of SOG or a polymer such as PMMA or PGMA in such a manner that the surface thereof is flat (FIG. 8(a)). Secondly, thermoplastic resin, for example, OFPR-800, ODUR-1010, OEBR-100, 1000 of Tokyo Ohka Kabushiki Kaisha, or the like is applied on the light transmissive layer 39a₁ by means of spin coating or the like, and the peripheral end parts over the light receiving part 3 are removed by photolithography or the like (FIG. 8(b)). Consecutively, the auxiliary convex lens 11 is formed by transforming the thermoplastic resin layer 11a by means of thermal reflow at the predetermined temperature, thereby to form the light output side light transmissive layer 39a. Here, when OFPR-800 is employed as the thermoplastic resin, the temperature is around 150° C. (FIG. 8(c)).

Figure 8D:
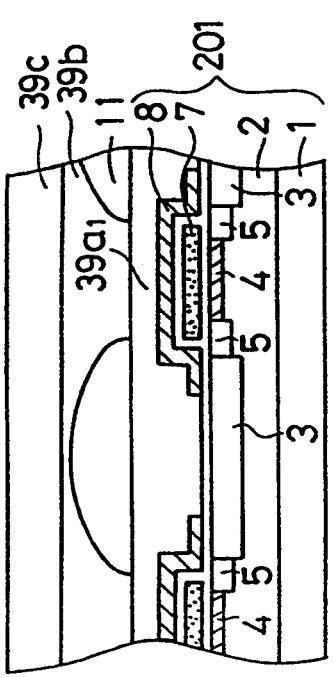
Figure 8E:
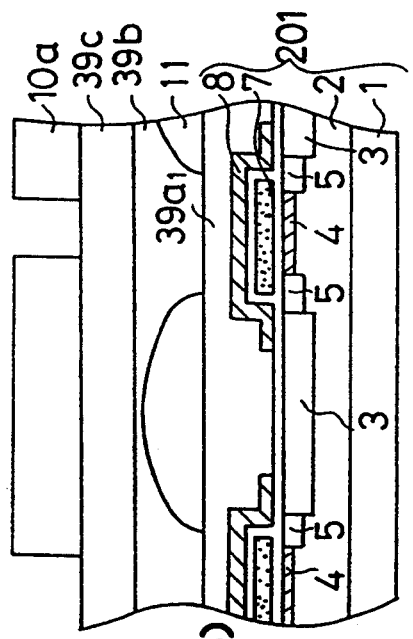
Figure 8F:
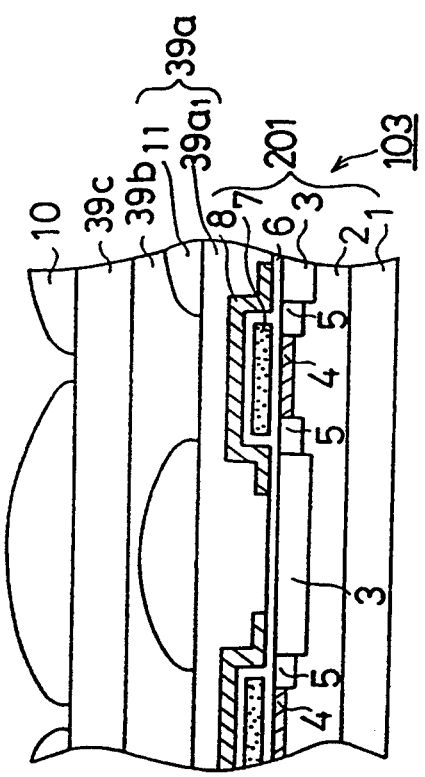

Further, by accumulating the silicon nitride film on the surface of the light output side light transmissive layer 39a by biassed ECR type plasma CVD below the thermal reflow temperature, the intermediate light transmissive layer 39b is formed, and, consecutively, by carrying out spin coating with an oxide film or a polymer, as well as the light transmissive layer 39a₁ on this intermediate light transmissive layer 39b, the light incident side light transmissive layer 39c of refractive index of approximately 1.5 is formed (FIG. 8(d)). Thereafter, application of thermoplastic resin and its patterning are carried out (FIG. 8(e)) similarly as in the process for producing the auxiliary convex lens, and by thermal reflow at a predetermined temperature and forming the microlens 10 having an ellipse configuration in plan, the solid-state imaging device 103 is completed (FIG. 8(f)).

In the solid-state imaging device of the third embodiment described above, the light beam dispersion layer 130 comprises the light incident side light transmissive layer 39c having a smaller refractive index, the light output side light transmissive layer 39a comprises the flat light transmissive layer 39a₁ and the auxiliary convex lens 11 and the intermediate light transmissive layer 39b having a larger refractive index, which is disposed between the light transmissive layers 39c and 30a. The contacting interface between the light incident side light transmissive layer 39c and the intermediate light transmissive layer 39b has a flat surface, and the portion over each light receiving part at the contacting interface between the intermediate light transmissive layer 39b and the light output side transmissive layer 39a has a convex shape, so that incident light collected by the lens layer 203 is refracted respectively by the flat contacting interface F3b and the convex contacting interface F3a and is dispersed.

Figure 12C:
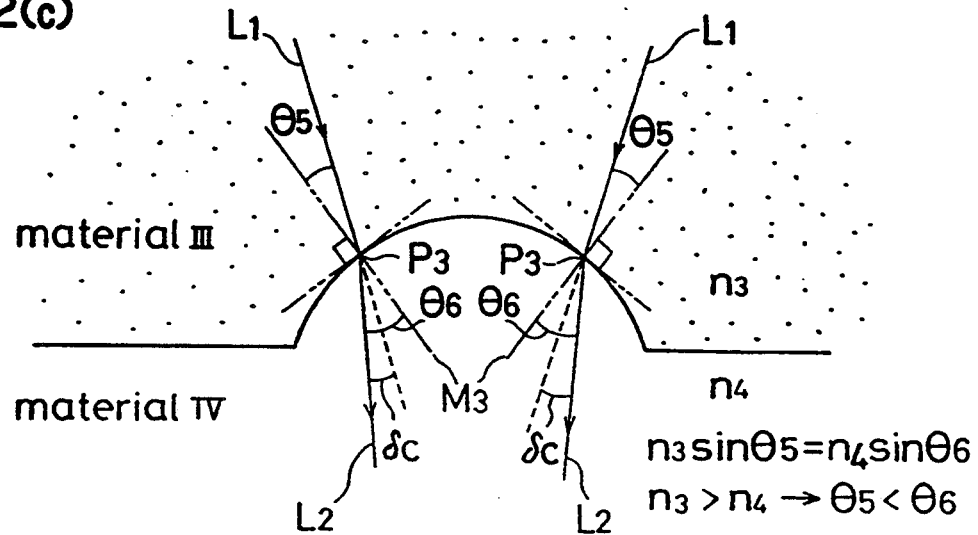

More particularly, at the flat contacting interface F3b, as illustrated in FIG. 12(a), incident light enters from the material I having a smaller refractive index and advances in the material II a larger refractive index and the collected light beam becomes closer to a parallel beam after passing through the interface. Further, at the convex contacting interface F3a, as illustrated in FIG. 12(c), incident light enters from a material III having a larger refractive index n3 and advances in a material IV having a smaller refractive index n4. In this case, suppose that an angle between a normal M3 at incident point P3 and incident light L1 is incident angle $\theta 5$, an angle between normal M3 and output light L2 is output angle $\theta 6$ and an angle between incident light L1 an output light L2 is refraction angle $\delta c$, according to the general formula, la, $n3 \sin\theta 5 = n4 \sin\theta 6$. Since n3 is larger than n4 in this case, $\theta 5$ is smaller than $\theta 6$ and refraction angle $\delta c$ is $\theta 6 - \theta 5$. In other words, in refraction at the convex contacting interface, incident light A becomes closer to a parallel light beam after passing through the interface, similarly as in the above-described embodiments. Therefore, incident light hardly broadens in the substrate part under the light receiving part and the same effect as described above is obtained in that smear is prevented almost completely. Further, the light incident/output side light transmissive layers 39c and 39a₁ having flat surfaces are provided so that more refracted light reaches the light receiving part through a longer optical path length. By employing these light transmissive layers adjusting the optical path length, the microlens 10 or the auxiliary convex lens 11 is shaped in the most easily formed configuration in the production process without restrictions from specifications of the solid-state imaging device concerning curvature or the like. However, even if those layers are not provided, the same fundamental effect of reducing smear is obtained.

Figure 9:
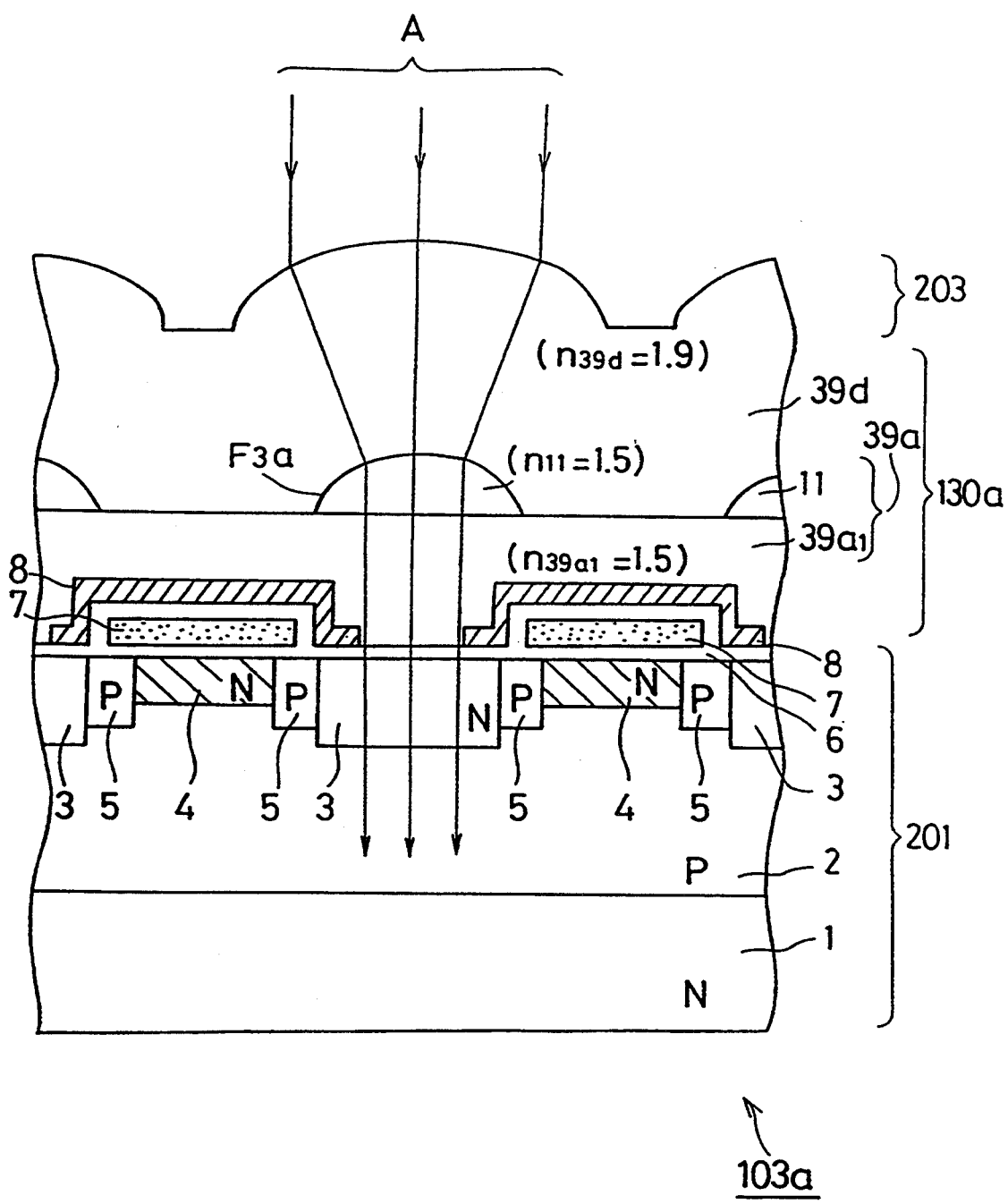
FIG. 9 is a cross sectional view illustrating a construction of a solid-state imaging device in accordance with a variation of the third embodiment of the present invention.

FIG. 9 is a cross sectional view illustrating a solid-state imaging device in accordance with a variation of the third embodiment. In a solid-state imaging device 103a of this embodiment, a light beam dispersion layer 130a comprises a light output side light transmissive layer 39a and a light incident side light transmissive layer 39d which is formed on the whole surface of the light transmissive layer 39a in such a manner that the convex and concave configuration of the substrate surface influences its surface configuration. Therefore, the lens layer 203 comprises the convex part of the surface of the light incident side light transmissive layer 39d and the light output side light transmissive layer 39a comprises a light transmissive layer 39a₁ having a flat surface, which is formed on the element part 201, and the auxiliary convex lens 11 which is formed on the light transmissive layer 39a₁ over the light receiving part 3. Here, the light transmissive layer 39a₁ and the auxiliary convex lens 11 comprise a polymer of approximately 1.5 refractive index and the light incident side light transmissive layer 39d comprises a silicon nitride film of approximately 1.9 refractive index. Other constructions are the same as those of the above-described third embodiment. Still, reference numeral F3a designates a convex contacting interface between the auxiliary convex lens 11 and the light incident side light transmissive layer 39d and numeral n39d designates the refractive index of the light transmissive layer 39d.

Figure 10A:
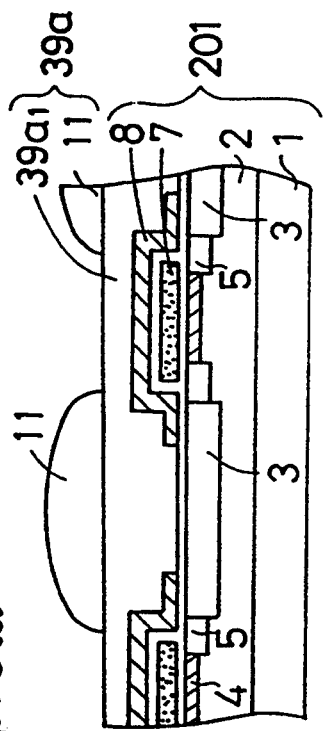
FIGS. 10(a) to 10(d) are cross sectional views explaining process steps in a method for producing the solid-state imaging device of FIG. 9.
Figure 10B:
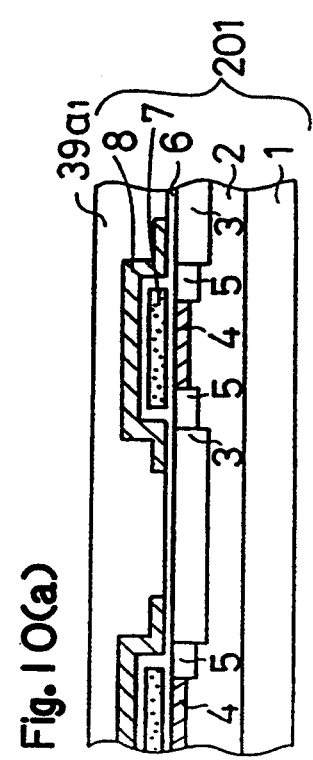
Figure 10C:
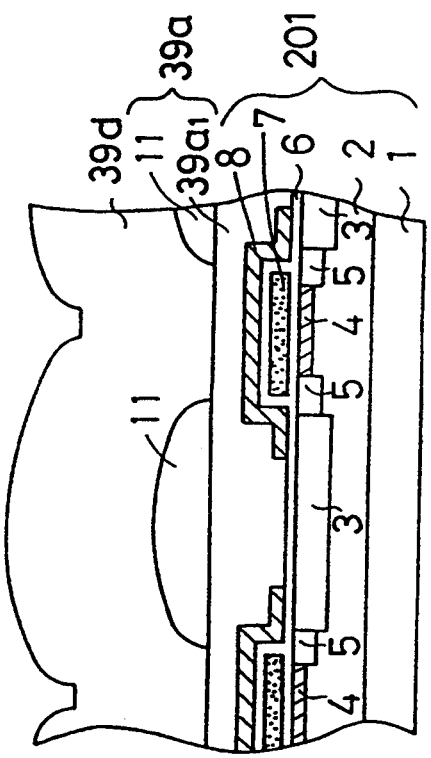
Figure 10D:
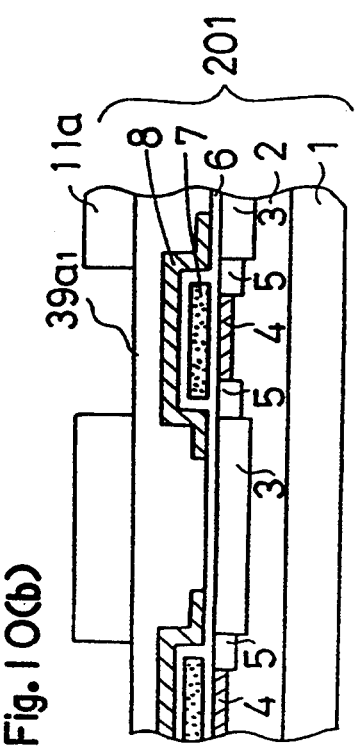

As explained in the production method of the third embodiment, after forming the element part 201, successively forming the light transmissive layer 39a₁ having a flat surface (FIG. 10(a)) and the auxiliary convex lens 11 (FIGS. 10(b) and 10(c)), the light beam dispersion layer 130a and the lens layer 203 are formed by accumulating the silicon nitride film by ECR plasma CVD below the thermal reflow temperature in such a manner that the convex and concave configuration of the substrate surface may influences its surface configuration, resulting in the completed solid-state imaging device 103a in accordance with the variation of the third embodiment (FIG. 10(d)).

In the variation of the third embodiment having such a construction, since the light beam dispersion layer 130a comprises the light incident side light transmissive layer 39d having a larger refractive index and the light output side light transmissive layer 39a having a smaller refractive index, which comprises the flat light transmissive layer 39a₁ and the auxiliary convex lens 11 and the portion F3a over the light receiving part at the contacting interface between the light transmissive layers formed into a convex lens shape, incident light collected by the lens layer 203, as explained with respect to FIG. 12(c), is dispersed due to refraction at the convex contacting interface F3a. As a result, broadening of incident light is suppressed in the substrate part under the light receiving part, thereby reducing smear. Further, since, after forming the respective auxiliary convex lenses in portions on the light output side light transmissive layer 39a comprising thermoplastic resin corresponding to the plural light receiving parts 3, the light beam dispersion layer 130a and the lens layer 203 are formed by accumulating the silicon nitride film having a larger refractive index than the thermoplastic resin below the thermal reflow temperature in such a manner that the convex and concave configuration of the substrate surface influence its surface configuration, it is possible to form the auxiliary lens 11 and the lens layer 203 in a single process, resulting in simplification of the production process.

Figure 11A:
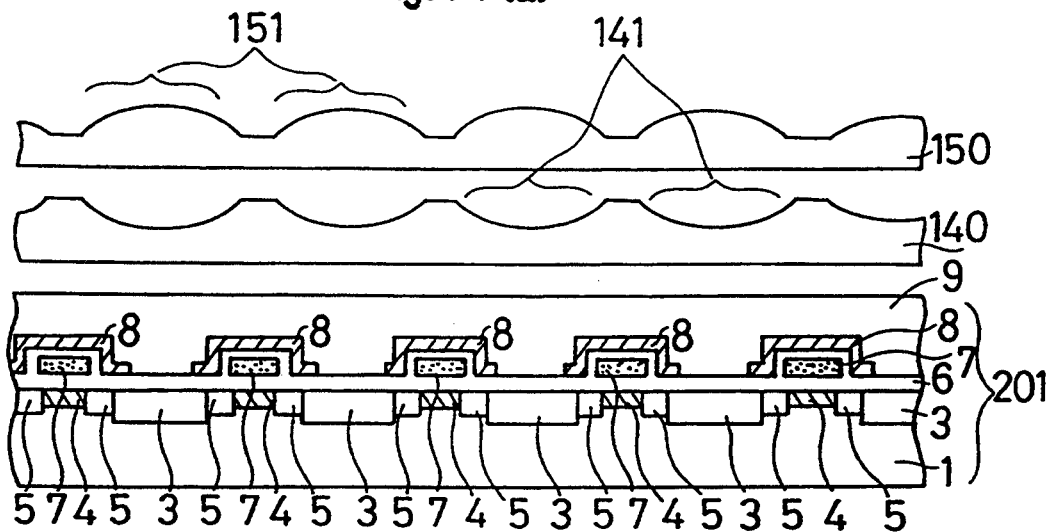
FIGS. 11(a) and 11(b) are cross sectional views illustrating a construction of a solid-state imaging device in accordance with a fourth embodiment of the present invention.
Figure 11B:
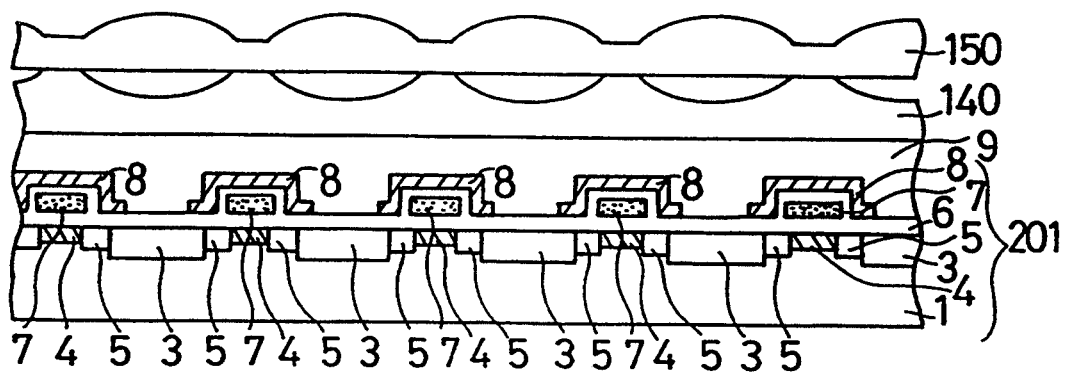

FIGS. 11(a) and 11(b) are cross sectional views explaining a solid-state imaging device in accordance with a fourth embodiment of the present invention, FIG. 11(a) illustrates an attachment of the light beam dispersion layer and the lens layer to the element part and FIG. 11(b) shows a completed solid-state imaging device.

In the figures, in a solid-state imaging device 104 in accordance with this embodiment, a concave lens array film 140 adhered to the element part 201 is employed for the light beam dispersion layer and a convex lens array film 150 adhered to the concave lens array film is employed for the lens layer. Here, the concave lens array film 140 comprises a plurality of concave lens parts 141 which are disposed in the same pitch as the two-dimensional array of the light receiving parts 3, the convex lens array film 150 comprises a plurality of convex lens parts 151 which are disposed in the same pitch as the two-dimensional array of the light receiving parts and each lens part has an elliptical configuration in plan in which the minor axis direction is in the CCD transfer direction. In addition, respective lens array films are produced separately with the element part 201, and several kinds of array films having curvatures of the lens part differentiated in accordance with the use of the solid-state imaging devices, can be prepared.

In the production method thereof, after forming the element part 201 on the semiconductor substrate, the flattening film 9 is formed on the whole surface (FIG. 11(a)). Thereafter, the concave lens array film 140 of which the concave lens part 141 has a predetermined curvature is adhered with an adhesive agent, and further, the convex lens array film 150 of which the convex lens part 151 has a predetermined curvature is adhered, resulting in a completed solid-state imaging device 104 (FIG. 11(b)).

In the solid-state imaging device of this embodiment having such a constitution, incident light collected by the convex lens array film 150 as the lens layer is dispersed due to refraction at the concave lens array film 140 as the light beam dispersion layer. As a result, broadening of incident light is suppressed in the substrate part under the light receiving part, reducing smear. Further, after forming the element part 201 and flattening its surface, it is possible to complete the solid-state imaging device just by adhering the manufactured lens array film and to select arbitrarily the curvature of the lens layer without constraints of the production process. Therefore, when various kinds of the solid-state imaging devices which have different functions are produced, the time for producing the lens layer and the light beam dispersion layer can be reduced to a large extent.

As described above, in a solid-state imaging device in accordance with the present invention, a light beam dispersion layer which includes two light transmissive layers having different refractive indices disposed between an element part and a lens layer disperses light collected by the lens layer due to refraction at the light transmissive layers to produce light closer to a parallel light beam. Incident light collected by the lens layer becomes collected light having a smaller converging angle by passing through the light beam dispersion layer and enters into a light receiving part. As a result, by suppressing broadening of incident light in a portion under the light receiving part of the semiconductor substrate, fewer photoelectrons enter the CCD channel region and smear is reduced.

Further, in the solid-state imaging device in accordance with the present invention, since a portion of a contacting interface between a light incident side light transmissive layer and a light output side light transmissive layer over the light receiving part is formed into a concave lens shape, dispersion of incident light at the concave contact interface is larger than at a flat contacting interface and incident light collected by the lens layer enters into the light receiving part as approximately a parallel light beam. As a result, incident light hardly broadens in the portion under the light receiving part of the semiconductor substrate and smear caused by photoelectrons entering the CCD channel region is almost completely prevented.

In a solid-state imaging device in accordance with the present invention, since a light beam dispersion layer is formed by sandwiching an intermediate light transmissive layer having a larger refractive index between light incident/output side light transmissive layers having a smaller refractive index, a contacting interface between the light incident side light transmissive layer and the intermediate light transmissive layer has a flat surface and the portions over the respective light receiving parts of the contacting interface between the intermediate light transmissive layer and the light output side light transmissive layer are formed into convex lenses, so that light collected by the lens layer is dispersed due to refraction at both the flat and the convex interfaces. As a result, incident light hardly broadens in the portion under the light receiving part of the semiconductor substrate and smear is almost completely prevented.

In addition, in a solid-state imaging device in accordance with the present invention, since a light beam dispersion layer comprises a light incident side light transmissive layer having a larger refractive index and a light output side light transmissive layer having a smaller refractive index and the portion over the light receiving part at the contacting interface between the light transmissive layers is formed into a convex lens, incident light collected by the lens layer is dispersed due to refraction at the convex contacting interface. As a result, broadening of incident light is suppressed in the semiconductor substrate part under the light receiving part, thereby reducing smear caused by photoelectrons entering into the CCD channel region.

In addition, in a solid-state imaging device in accordance with the present invention, since a concave lens array film which comprises a plurality of concave lenses corresponding to the pattern of the light receiving parts is adhered to the element part as the light beam dispersion layer and a convex lens array film which comprises a plurality of convex lenses corresponding to the pattern of the light receiving parts is adhered to the concave lens array film, incident light collected by the convex lens array film is dispersed due to refraction at the concave lens array film, to reduce smear. Further, the light beam dispersion layer and the lens layer are formed just by adhering the concave lens array film and the convex lens array film on the element part, resulting in simplification of the production process.

In a production method of a solid-state imaging device in accordance with the present invention, since a light beam dispersion layer is formed by forming a sidewall by coating and anisotropic etching of a first transparent insulating film in peripheral portions of the light receiving part on the semiconductor substrate in which a plurality of light receiving parts and a charge transfer part are formed, and a second transparent insulating film of which a portion over the light receiving part is made concave utilizing the sidewall and a third transparent insulating film having a smaller refractive index than the second transparent insulating film on the second film, a light beam dispersion layer having the concave refraction interface corresponding to each light receiving part is formed in a relatively simple process without employing an etching mask or the like.

In a production method of a solid-state imaging device in accordance with the present invention, since a light beam dispersion layer is formed by accumulating a first transparent film on the whole surface of a semiconductor substrate in which a plurality of light receiving parts and a charge transfer part are formed in such a manner that the surface of the film is flat, forming a concave part over the light receiving part of the first transparent insulating film by isotropic etching of the first transparent insulating film employing an anti-etching mask, and accumulating a second transparent insulating film having a refractive index smaller than that of the first transparent insulating film on the first film after removing the anti-etching mask, the curvature or the size of the concave refraction interface of the light beam dispersion layer is easily adjusted by changing the aperture pattern of the anti-etching mask, the etching conditions or the like.

In a production method of a solid-state imaging device in accordance with the present invention, since a light beam dispersion layer is formed by accumulating a first thermoplastic transparent resin film on the whole surface of a semiconductor substrate in which a plurality of light receiving parts and charge transfer parts are formed in such a manner that the convex and concave configuration of the substrate surface may influence its surface configuration, forming a portion of the first transparent resin film over the light receiving part into the predetermined concave shape and forming a second transparent resin film having a smaller refractive index than the transparent resin film thereon, it is possible to form the light beam dispersion layer having a concave refraction interface corresponding to each light receiving part in a relatively simple process without employing a sidewall or an etching mask layer.

In a production method of a solid-state imaging device in accordance with the present invention, since a light beam dispersion layer is formed by forming convex lenses in the respective regions corresponding to a plurality of light receiving parts on a first transparent insulating film by patterning and thermal reflow of a thermoplastic transparent resin on the flat first transparent insulating film on a semiconductor substrate in which a plurality of light receiving parts and charge transfer gates are formed, forming a second transparent film by accumulating a transparent material having a refractive index larger than the thermoplastic resin over the whole surface below the thermal reflow temperature in such a manner that the surface is flat, and forming a third transparent insulating film having a refractive index smaller than the second transparent film on the second film, the convex lens on the first transparent insulating film is formed into a shape which is most easily formed in a single process and it is possible to easily adjust the converging angle or optical path length of collected light beam by adjusting the thicknesses of the second and the third transparent insulating film.

In a production method of the solid-state imaging device in accordance with the present invention, since the light beam dispersion layer and the lens layer are formed by forming auxiliary convex lenses in the respective regions corresponding to a plurality of light receiving parts and accumulating a transparent material having a refractive index larger than the thermoplastic resin below a thermal reflow temperature in such a manner that the convex and concave configuration of the substrate surface influences its surface configuration, it is possible to form a flattening film and the lens layer on the auxiliary convex lens in a single process, resulting in simplification of the production process.

What is claimed is:

1. A solid-state imaging device comprising:
    a semiconductor substrate;
    an element part including a plurality of light responsive elements for generating change carriers in response to incident light and a transfer part for transferring the charge carriers generated in each light responsive element, said element part and said transfer part being incorporated in said semiconductor substrate;
    a lens layer disposed on said element part and including convex lenses for collecting incident light into respective light responsive elements; and
    a light beam dispersion layer disposed between said lens layer and said element part and including light transmissive layers having respective refractive indices for dispersing light collected by said lenses so that collected light entering respective light responsive elements is closer to a parallel beam than is the incident light wherein said light beam dispersion layer includes a light incident side light transmissive layer having a first refractive index, a light output side light transmissive layer having a second refractive index, and an intermediate light transmissive layer having a third refractive index larger than both the first and the second refractive indices, said light incident side light transmissive layer contacting said intermediate light transmissive layer at a planar interface, and said intermediate light transmissive layer contacting said light output side light transmissive layer at a non, planar interface including a convex lens opposite a light responsive element.

2. The solid-state imaging device of claim 1 wherein said light output side light transmissive layer comprises a planar light transmissive layer on said element part.

3. The solid-state imaging device of claim 2 wherein said light incident side light transmissive layer, said planar light transmissive layer, and said convex lens comprise a polymer selected from the group consisting of polymethyl methacrylate and polyglycidyl methacrylate having a refractive index of about 1.5 and said intermediate light transmissive layer comprises a silicon nitride film having a refractive index of about 1.9.

4. A solid-state imaging device comprising:
    a semiconductor substrate;
    an element part including a plurality of light responsive elements for generating charge carriers in response to incident light and a transfer part for transferring the charge carriers generated in each light responsive element part and said transfer being incorporated in said semiconductor substrate;
    a lens layer disposed on said element part and including convex lenses for collecting incident light into respective light responsive elements; and
    a light beam dispersion layer disposed between said lens layer and said element part and including a light incident side light transmissive layer having a first refractive index and a light output side light transmissive layer having a second refractive index smaller than the first refractive index, said light beam dispersion layer dispersing light collected by said lenses so that collected light entering respective light responsive elements is closer to a parallel bean than is the incident light wherein said light incident side light transmissive layer contacts said light output side light transmissive layer at an interface including an array of convex lenses opposite a light responsive element.

5. The solid-state imaging device of claim 4 wherein said light output side light transmissive layer comprises a planar light transmissive layer on said element part.

6. The solid-state imaging device of claim 5 wherein said light incident side light transmissive layer comprises a silicon nitride film having a refractive index of about 1.9 and said planar light transmissive layer and said convex lens of said light output side light transmissive layer comprise a polymer selected from the group consisting of polymethyl methacrylate and polyglycidyl methacrylate having a refractive index of about 1.5.

* * * * *

UNITED STATES PATENT AND TRADEMARK OFFICE
CERTIFICATE OF CORRECTION

PATENT NO.  : 5,371,397
DATED       : December 6, 1994
INVENTOR(S) : Maegawa et al.

It is certified that error appears in the above-indentified patent and that said Letters Patent is hereby corrected as shown below:

Column 19, line 9, change "change" to --charge--.

Column 20, line 27, change "bean" to --beam--.

Signed and Sealed this

Twenty-fifth Day of April, 1995

Attest:

BRUCE LEHMAN

*Attesting Officer*  *Commissioner of Patents and Trademarks*